US011032941B2

(12) United States Patent
Le et al.

(10) Patent No.: US 11,032,941 B2
(45) Date of Patent: Jun. 8, 2021

(54) MODULAR THERMAL ENERGY MANAGEMENT DESIGNS FOR DATA CENTER COMPUTING

(71) Applicant: Intel Corporation, Santa Clara, CA (US)

(72) Inventors: Minh Le, North Plains, OR (US); Thomas Boyd, Vancouver, WA (US); Bijoyraj Sahu, Portland, OR (US); Evan Chenelly, Portland, OR (US); Christopher Wade Ackerman, Phoenix, AZ (US); Carlos Alvizo Flores, Jalisco (MX); Craig Jahne, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 130 days.

(21) Appl. No.: 16/368,341

(22) Filed: Mar. 28, 2019

(65) Prior Publication Data
US 2019/0223324 A1 Jul. 18, 2019

(51) Int. Cl.
*H05K 7/20* (2006.01)

(52) U.S. Cl.
CPC ..... *H05K 7/20281* (2013.01); *H05K 7/20236* (2013.01); *H05K 7/20263* (2013.01); *H05K 7/20272* (2013.01); *H05K 7/20409* (2013.01); *H05K 7/20509* (2013.01);
(Continued)

(58) Field of Classification Search
CPC .. B05C 9/14; H05K 7/20772; H05K 7/20236;
H05K 1/181; H05K 7/20281; H05K 7/203; H05K 7/20572; H05K 7/20781; H05K 7/20809; H05K 7/20836; H05K 7/20263;
(Continued)

(56) References Cited

U.S. PATENT DOCUMENTS 3,406,244 A * 10/1968 Sevgin ............... H01J 7/24
174/15.1
7,092,254 B1 * 8/2006 Monsef .............. H01L 23/473
361/699
(Continued)

OTHER PUBLICATIONS

Alibaba, "Immersion Cooling for Green Computing", OCP 2018, 3 pages [retrieved on Jul. 22, 2019]. Retrieved from the Internet:<http://www.youtube.com/watch?v=5wJ6XeLTneE>.
(Continued)

*Primary Examiner* — Binh B Tran
*Assistant Examiner* — Michael A Matey
(74) *Attorney, Agent, or Firm* — Schwabe, Williamson & Wyatt, P.C.

(57) ABSTRACT

Systems, apparatuses, methods, and computer-readable media are presented for managing an apparatus for thermal energy management including a first container. The first container includes a first cavity, and is configured to hold a first liquid coolant within the first cavity to at least partially surround a second container. The second container includes a second cavity configured to hold one or more heat sources, and a second liquid coolant to at least partially surround the one or more heat sources. The second container is sealed to separate the first liquid coolant from the second liquid coolant. Other embodiments may be described and/or claimed.

23 Claims, 35 Drawing Sheets

(52) U.S. Cl.
CPC ..... *H05K 7/20772* (2013.01); *H05K 7/20781* (2013.01); *H05K 7/20836* (2013.01)

(58) Field of Classification Search
CPC ........... H05K 7/20272; H05K 7/20409; H05K 7/20509
See application file for complete search history.

(56) References Cited

U.S. PATENT DOCUMENTS

| | | | | |
|---|---|---|---|---|
| 2005/0268647 | A1* | 12/2005 | Finamore | H01M 8/04208 62/607 |
| 2007/0084588 | A1* | 4/2007 | Eckberg | H05K 7/20272 165/104.32 |
| 2007/0230128 | A1* | 10/2007 | Kim | F28D 15/046 361/699 |
| 2008/0055575 | A1* | 3/2008 | Nagasaka | G03F 7/7085 355/30 |
| 2009/0251672 | A1* | 10/2009 | Nagasaka | G03F 7/70716 355/30 |
| 2011/0132579 | A1* | 6/2011 | Best | H05K 7/20772 165/104.31 |
| 2014/0307384 | A1* | 10/2014 | Best | H05K 7/1497 361/679.53 |
| 2016/0286694 | A1* | 9/2016 | Krishnan | H05K 7/20272 |
| 2016/0330865 | A1* | 11/2016 | Mathew | G06F 1/206 |
| 2016/0345461 | A1* | 11/2016 | Smith | H05K 7/20818 |
| 2017/0064862 | A1* | 3/2017 | Miyoshi | H01L 21/67109 |
| 2017/0156233 | A1* | 6/2017 | Moss | H05K 7/20763 |
| 2017/0280587 | A1* | 9/2017 | Watanabe | H05K 7/20272 |
| 2017/0328648 | A1* | 11/2017 | Dede | F28D 15/06 |
| 2018/0153058 | A1* | 5/2018 | Hirai | H05K 7/20781 |
| 2019/0200483 | A1* | 6/2019 | Tian | G06F 1/206 |
| 2019/0239390 | A1* | 8/2019 | Goode | H05K 7/20281 |
| 2019/0281727 | A1* | 9/2019 | Fujiwara | H05K 7/20272 |
| 2019/0380228 | A1* | 12/2019 | Hirai | G06F 1/20 |
| 2019/0383559 | A1* | 12/2019 | Aoki | F28D 1/0213 |
| 2020/0022289 | A1* | 1/2020 | Marazzo | H05K 7/20818 |
| 2020/0093038 | A1* | 3/2020 | Enright | H05K 7/203 |
| 2020/0150731 | A1* | 5/2020 | Wang | H05K 7/20 |
| 2020/0178414 | A1* | 6/2020 | Bulinski | C07C 211/24 |
| 2020/0267872 | A1* | 8/2020 | Harada | H05K 7/203 |
| 2020/0288600 | A1* | 9/2020 | Gao | H05K 7/20272 |
| 2020/0288601 | A1* | 9/2020 | Gao | H05K 7/20236 |
| 2020/0315060 | A1* | 10/2020 | Chen | H05K 7/20781 |

OTHER PUBLICATIONS

Arman Shehabi et al., "United States Data Center Energy Usage Report", LBNL-1005775, Jun. 2016, 65 pages [retrieved on Jul. 22, 2019]. Retrieved from the Internet:<http://www.eta.lbl.gov/sites/all/files/publications/lbnl-1005775_v2.pdf>.

"Performance-Liquid-CPU-Cooler-Deconstruct-3", 12 pages [retrieved on Jul. 22, 2019]. Retrieved from the Internet: <http://www.pcper.com/reviews/Cases-and-Cooling/Corsair-Hydro-Series-H80i-High->.

* cited by examiner

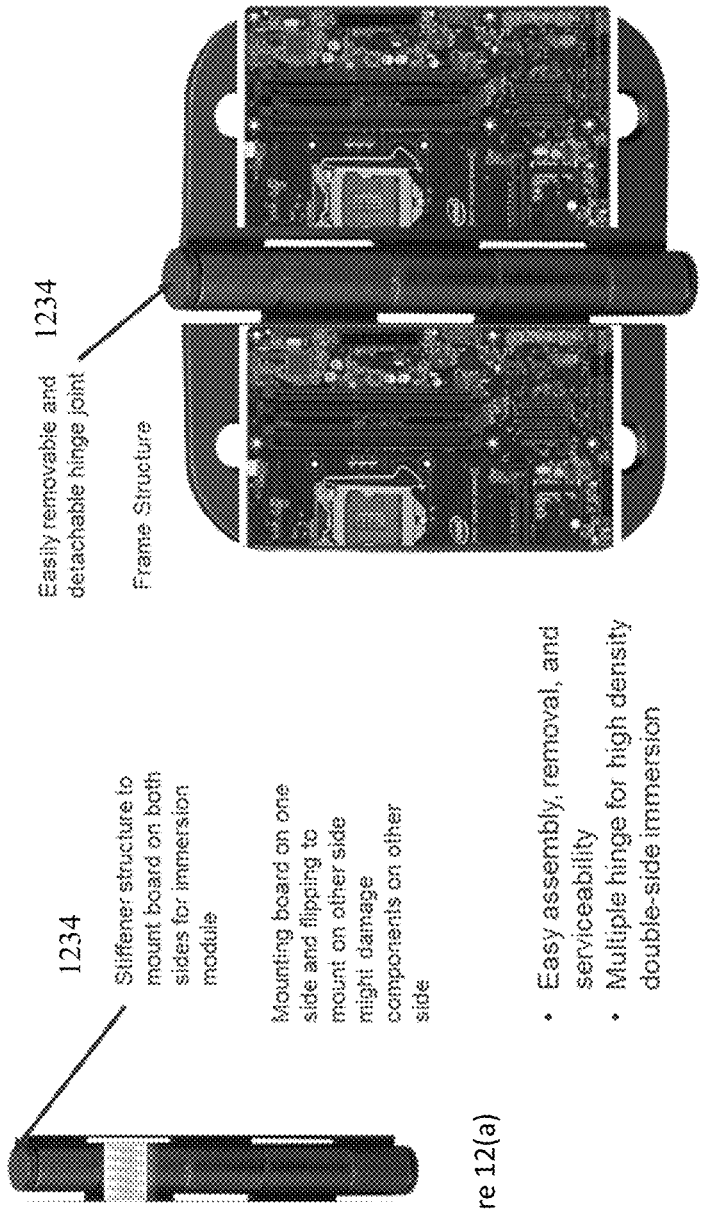

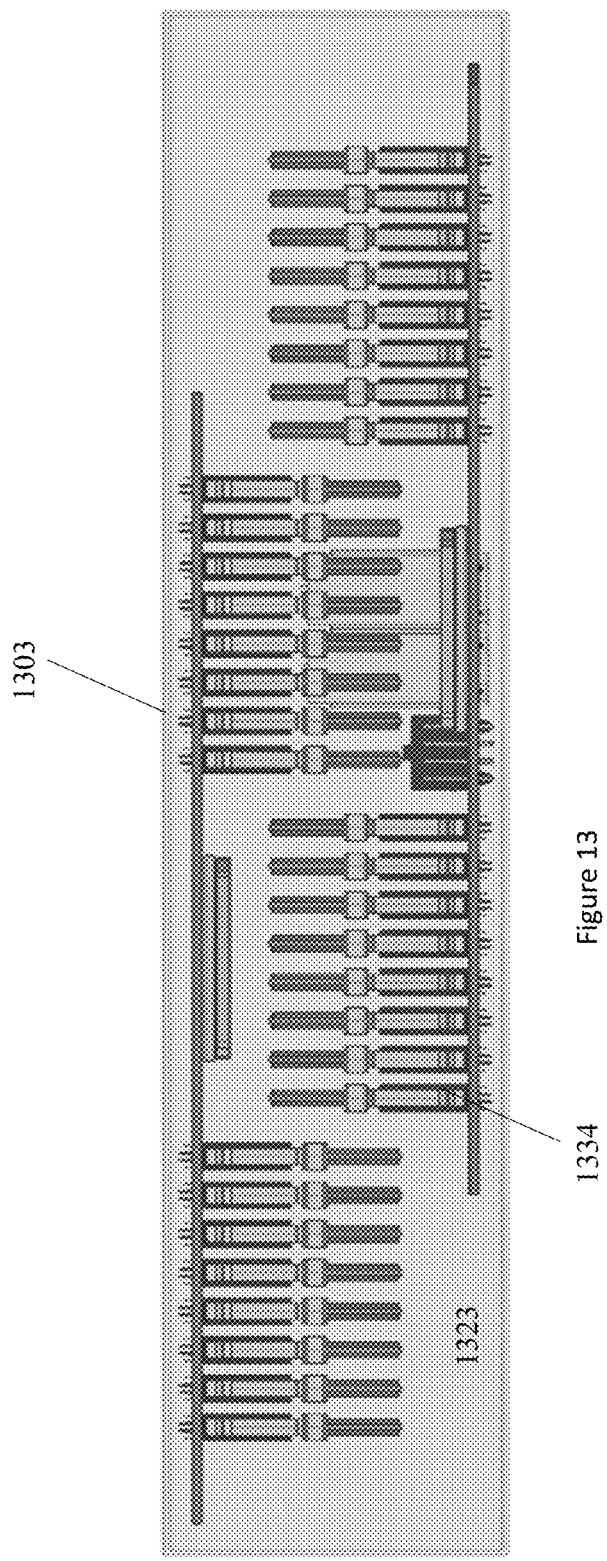

1405

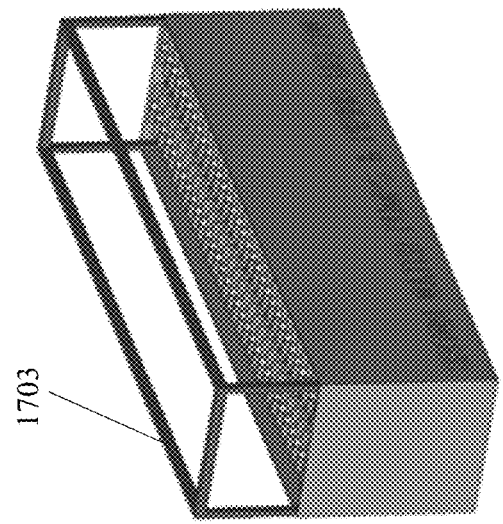
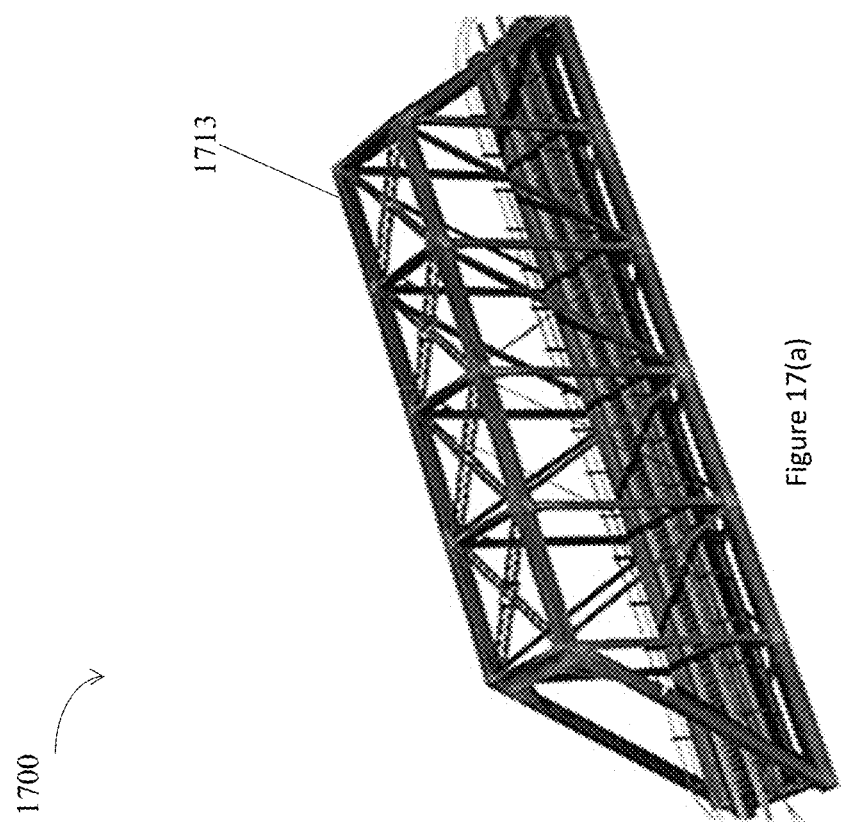

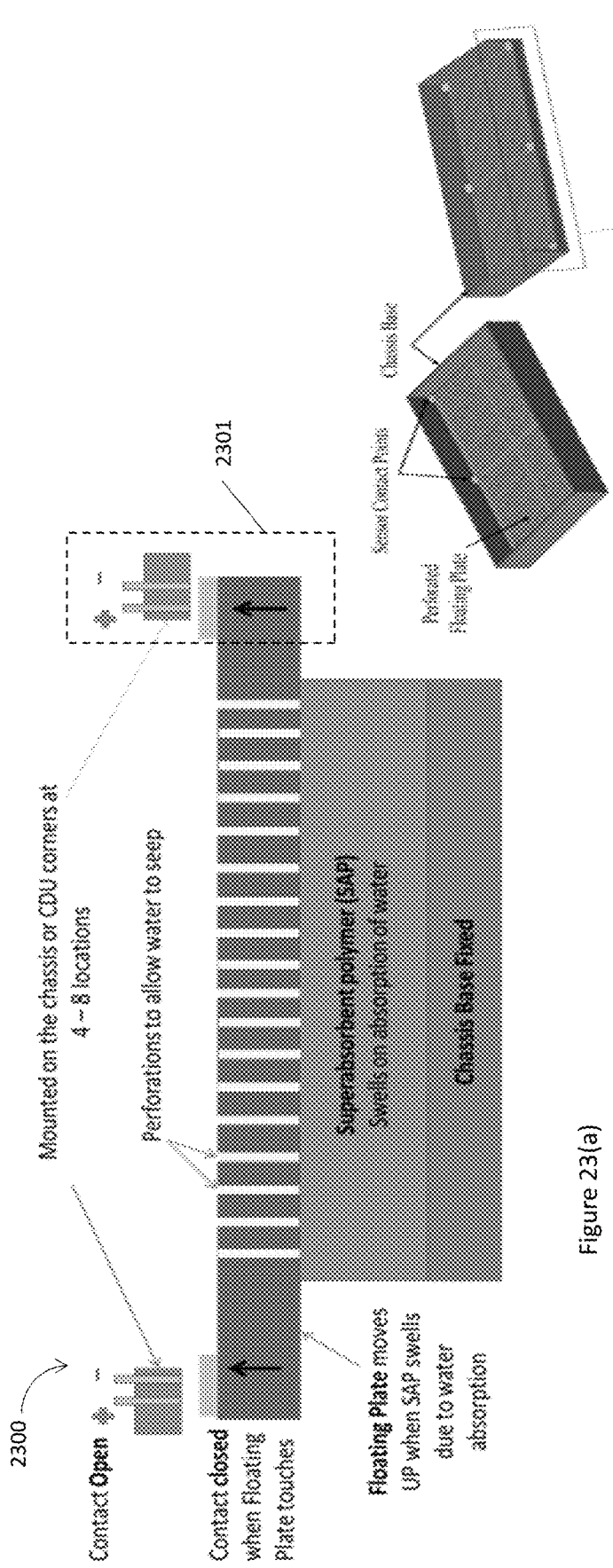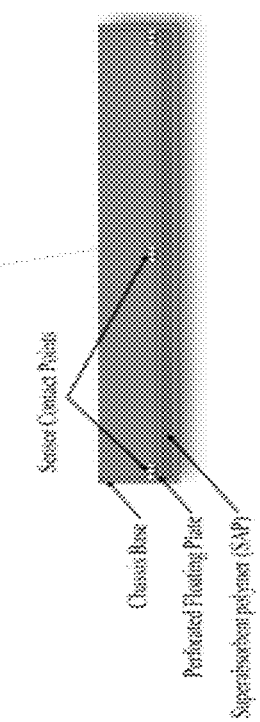
Figure 23(a)
Figure 23(b)

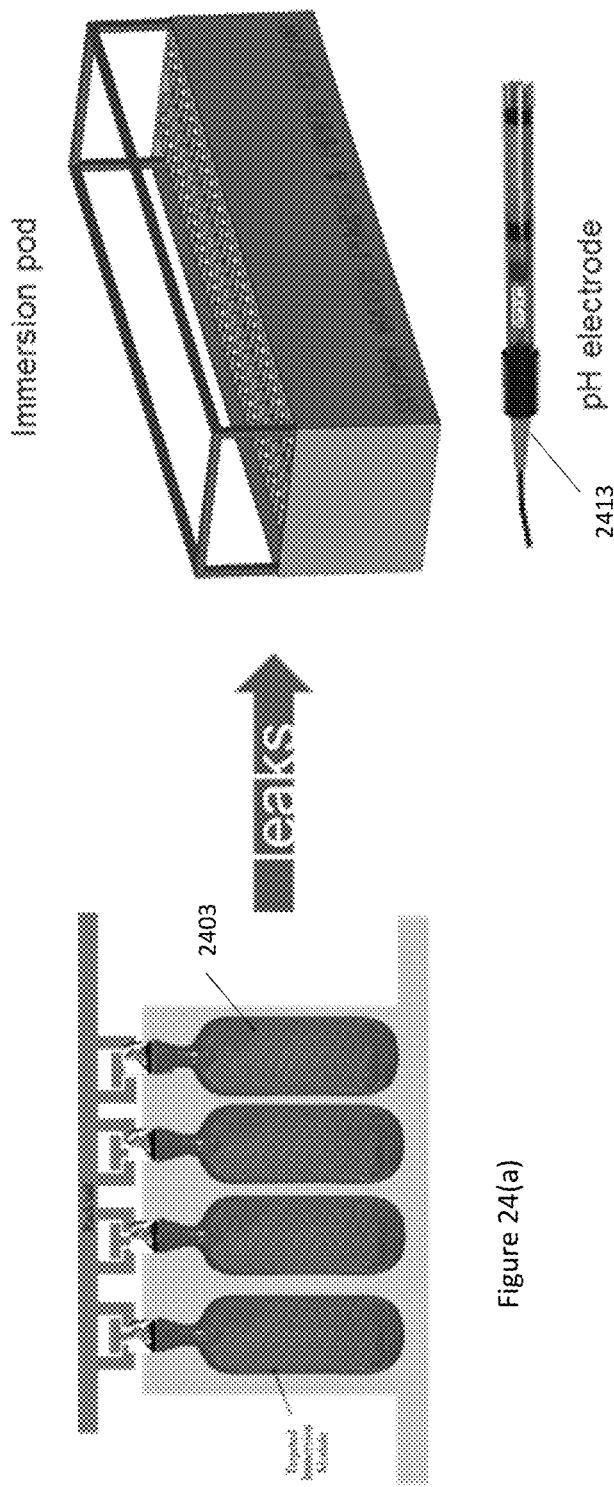

Figure 2. Bayesian dynamic network : Memory attribute features representation

MODULAR THERMAL ENERGY MANAGEMENT DESIGNS FOR DATA CENTER COMPUTING

FIELD

Embodiments of the present disclosure relate generally to the technical field of computing, in particular, thermal energy management for data center computing.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

With the advance of the Internet, and increased popularity of cloud computing, the issue of efficient and effective thermal management has become of increasing importance for data center computing. Data centers may include computer systems and associated components, such as telecommunications and storage systems, hosted in one or more racks, buildings, or other spaces. Data centers, when managed properly, can provide a secure environment that reduces the chances of a security breach while providing improved computing performance and energy efficiency. Data centers may be classified into various levels or tiers according to some industry organization. Each level or tier provide different requirements on the data centers, e.g., in terms of redundant components, critical load distribution paths, cooling, and many other specifications. And clients/customers often selected services from data centers with the appropriate ratings to meet their computing needs. Computer systems and associated components, such as telecommunications and storage systems may generate heat or thermal energy during operations. Thus, appropriate thermal energy management of these data center equipment are important for the data centers to meet their ratings/obligations to their computing clients.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 12(a)-12(b) illustrate an exemplary mechanical supporting system, which may be used to place a heat source, in accordance with various embodiments.

FIG. 13 illustrates another exemplary second container to contain multiple heat sources, in accordance with various embodiments.

FIG. 17(a)-17(b) illustrate an exemplary shipping system including multiple containers, in accordance with various embodiments.

FIG. 23(a)-23(b) illustrate example components for leak detection of a thermal energy management system, in accordance with various embodiments.

FIG. 24(a)-24(b) illustrate example components for leak detection of a thermal energy management system, in accordance with various embodiments.

DETAILED DESCRIPTION

Figure 1A:
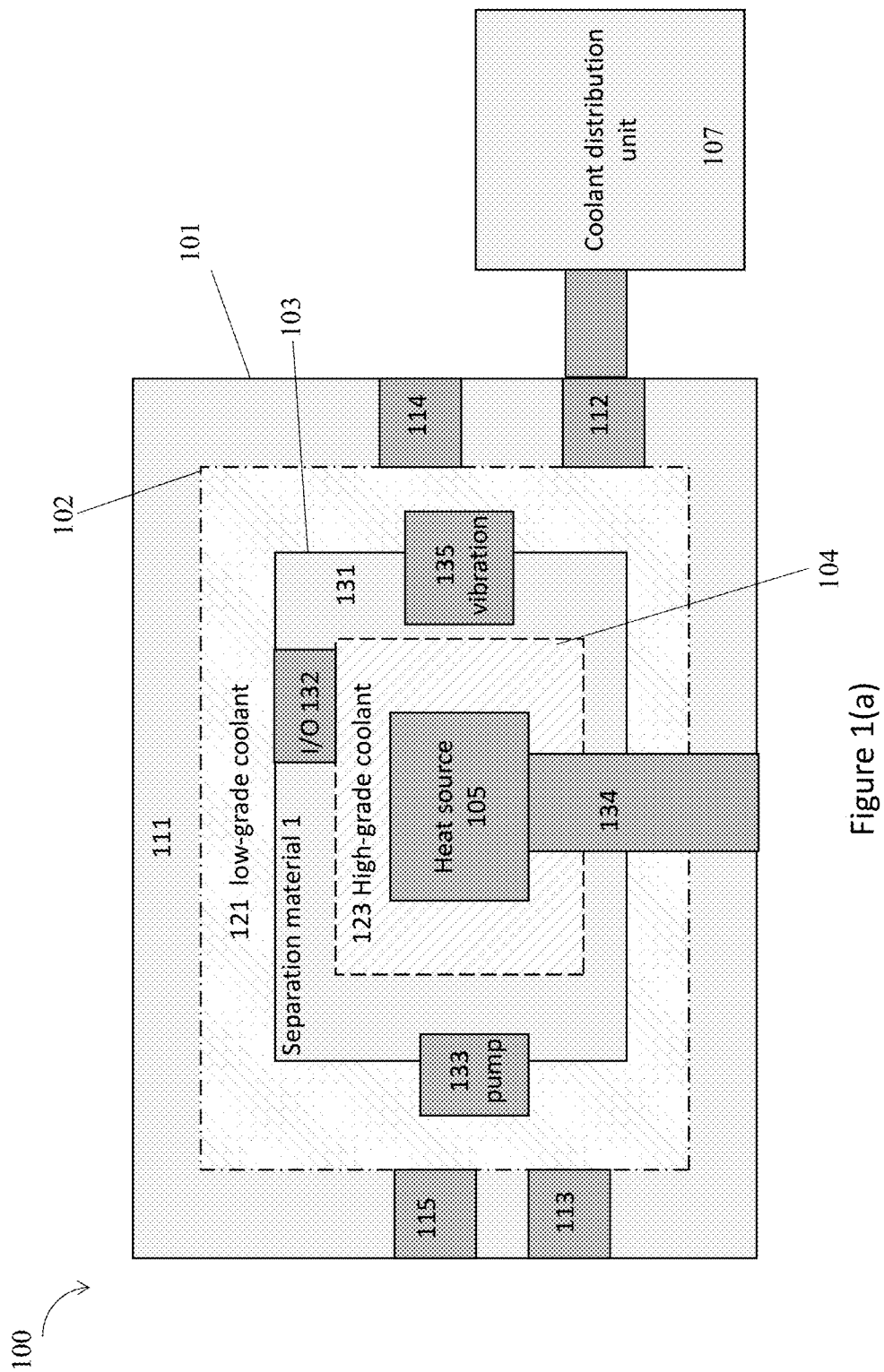
FIGS. 1(a)-1(b) illustrate exemplary thermal energy management apparatus including multiple containers to hold a first liquid coolant separated from a second liquid coolant, in accordance with various embodiments.

Data centers may include computer systems and related components, such as telecommunications and storage systems, hosted in one or more racks, buildings, or other spaces. Computer systems, telecommunications and storage systems may include multiple computing components or modules, e.g., processors such as servers, processor cores, memory units, or other computing components, assembled together by some mechanical support, e.g., a container, a cage, a rack, or a chassis. For example, in a datacenter, a number of servers or nodes may be placed in a rack, where a slot of the rack may include a server or a node together with some other computing components such as memory units. Each server or node may include one or more processors. Individual processors may include one or more processor cores.

A computing component or a module of a computing platform may generate heat or thermal energy during operation. Hence, a computing component or other heat generating device may be referred to as a heat source or a heat sink. Various thermal energy management solutions, e.g., fans, or liquid coolant based cooling solutions, may be used for managing thermal energy generated by multiple computing components or modules of a computing platform in a data center. For example, a liquid based cooling solution may use a liquid coolant inside a heat pipe or a cold plate to dissipate the heat, where the liquid coolant may include water, ammonia, freon, or any other liquid coolant.

Immersion cooling is a technology where an entire computer server hardware or system is immersed in a liquid coolant to capture 100% heat generated by the computer server hardware or system. Immersion cooling may have improved cooling performance compared to other previous thermal energy management solutions, such as fans, or other liquid based cooling solutions. Immersion cooling systems may provide flexible solutions ranging from immersion tank enclosure to standalone container for deployment in more traditional or harsher environments. However, immersion cooling systems may have high costs, e.g., $1000/gal, associated with the liquid coolant used. There is not an ecosystem to support sufficient level of reliability for components that can operate within the liquid coolant. Furthermore, it is difficult to design systems architecture and components for immersion cooling systems. For example, a typical immersion cooling system uses huge containers with server boards and components immersed within liquid coolant, which are expensive, difficult to service, and not modular in design. The cost of thousands gallons of liquid coolant used in the huge containers in a traditional immersion cooling system is prohibitive. An immersion cooling system is typically accessed from top, which limits the vertical scaling of infrastructure, hence reducing power density per square foot. It will be difficult for such immersion cooling systems to be used in emerging data center design to meet the assembly and disassembly requirements for easy installation and repair.

Embodiments herein may include various design and implementations related to thermal energy management for data centers. Embodiments thermal energy management systems include modular design using various sized tanks, containers, targeted immersion containers, material, construction, sealing and interfaces, design and layout. In addition, the heat sources, e.g., the computer server hardware or system, have designs and packages that are compatible with the thermal energy management solutions used in a data center. Additional features include organic contaminants removal from the liquid coolants or containers, lines flushing and cleaning; leak detection, telemetry, and management; vent and pressure control, safety features, and input/output (I/O) interfaces and sealing. Embodiments may be viewed as improvements over the traditional immersion cooling system, but are not limited to such systems.

In some detail, embodiments for thermal energy management systems herein for data centers may include multiple containers to hold a first liquid coolant separated from a second liquid coolant. The thermal energy management systems, which may still be referred as immersion cooling systems, are modular and quick-to-build by assembling different containers together. The thermal energy management systems may enable stacking of the server systems to achieve high power density per square foot, and can be applicable to traditional air-cooled 1 U/2 U data centers. High grade and high cost liquid coolant may be used only in vicinity of the heat sources, e.g., the server components, hence the overall cost of the thermal energy management systems may be reduced.

In embodiments, an apparatus for thermal energy management includes a first container. The first container has one or more cavities including a first cavity. The first container includes a first material in a wall of the first container, one or more input inlets in the wall, and one or more output outlets in the wall. Furthermore, the first container is configured to hold a first liquid coolant within the first cavity to at least partially surround one or more containers including a second container. The first liquid coolant, when held in the first container, circulates through at least an input inlet of the one or more input outlets and at least an output outlet of the one or more output outlets. The second container includes a second material in a wall of the second container, and a second cavity configured to hold one or more heat sources, and a second liquid coolant to at least partially surround the one or more heat sources. The second container is sealed to separate the first liquid coolant from the second liquid coolant.

In embodiments, a method for thermal energy management of a thermal energy management system includes monitoring air flow or bubble events to detect leaks in an air loop of a thermal energy management system. The thermal energy management system includes a coolant distribution unit (CDU), and a first container having one or more input inlets in a wall, and one or more output outlets in the wall. An output outlet of the one or more output outlets or an input inlet of the one or more input inlets is coupled with the CDU, The first container further includes one or more cavities including a first cavity. The first container is configured to hold a first liquid coolant within the first cavity to at least partially surround one or more containers including a second container. The first liquid coolant, when held in the first container, circulates through at least the input inlet or at least the output outlet. The second container includes a second cavity configured to hold one or more heat sources, and a second liquid coolant to at least partially surround the one or more heat sources. The second container is sealed to separate the first liquid coolant from the second liquid coolant. The thermal energy management system further includes the air loop between the CDU, the first container, and the second container. The method further includes sending an alert to a datacenter management system based on the detected leaks; and stopping the first liquid coolant from circulating through the input inlet or the output outlet based on the detected leaks.

In embodiments, a thermal energy management system includes a coolant distribution unit (CDU), and a first container having one or more input inlets in a wall, and one or more output outlets in the wall. An output outlet of the one or more output outlets or an input inlet of the one or more input inlets is coupled with the CDU, The first container further includes one or more cavities including a first cavity. The first container is configured to hold a first liquid coolant within the first cavity to at least partially surround one or more containers including a second container. The first liquid coolant, when held in the first container, circulates through at least the input inlet or at least the output outlet. The second container includes a second cavity configured to hold one or more heat sources, and a second liquid coolant to at least partially surround the one or more heat sources. The second container is sealed to separate the first liquid coolant from the second liquid coolant. The thermal energy management system further includes an air loop between the CDU, the first container, and the second container.

In the description to follow, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A or B" and "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used hereinafter, including the claims, the term "unit," "engine," "module," or "routine" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, the term "circuitry" refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD), (for example, a field-programmable gate array (FPGA), a programmable logic device (PLD), a complex PLD (CPLD), a high-capacity PLD (HCPLD), a structured ASIC, or a programmable System on Chip (SoC)), digital signal processors (DSPs), etc., that are configured to provide the described functionality. In some embodiments, the circuitry may execute one or more software or firmware programs to provide at least some of the described functionality.

As used herein, the term "processor circuitry" may refer to, is part of, or includes circuitry capable of sequentially and automatically carrying out a sequence of arithmetic or logical operations; recording, storing, and/or transferring digital data. The term "processor circuitry" may refer to one or more application processors, one or more baseband processors, a physical central processing unit (CPU), a general purpose processing unit (GPU), a single-core processor, a processor core, a dual-core processor, a triple-core processor, a quad-core processor, and/or any other device capable of executing or otherwise operating computer-executable instructions, such as program code, software modules, and/or functional processes.

As used herein, the term "interface circuitry" may refer to, is part of, or includes circuitry providing for the exchange of information between two or more components or devices. The term "interface circuitry" may refer to one or more hardware interfaces (for example, buses, input/output (I/O) interfaces, peripheral component interfaces, network interface cards, and/or the like).

As used herein, the term "computer device" may describe any physical hardware device capable of sequentially and automatically carrying out a sequence of arithmetic or logical operations, equipped to record/store data on a machine readable medium, and transmit and receive data from one or more other devices in a communications network. A computer device may be considered synonymous to, and may hereafter be occasionally referred to, as a computer, computing platform, computing device, etc. The term "computer system" may include any type interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. Examples of "computer devices", "computer systems", etc. may include cellular phones or smart phones, feature phones, tablet personal computers, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management Systems (EEMSs), electronic/engine control units (ECUs), vehicle-embedded computer devices (VECDs), autonomous or semi-autonomous driving vehicle (hereinafter, simply ADV) systems, in-vehicle navigation systems, electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle.

Figure 1B:
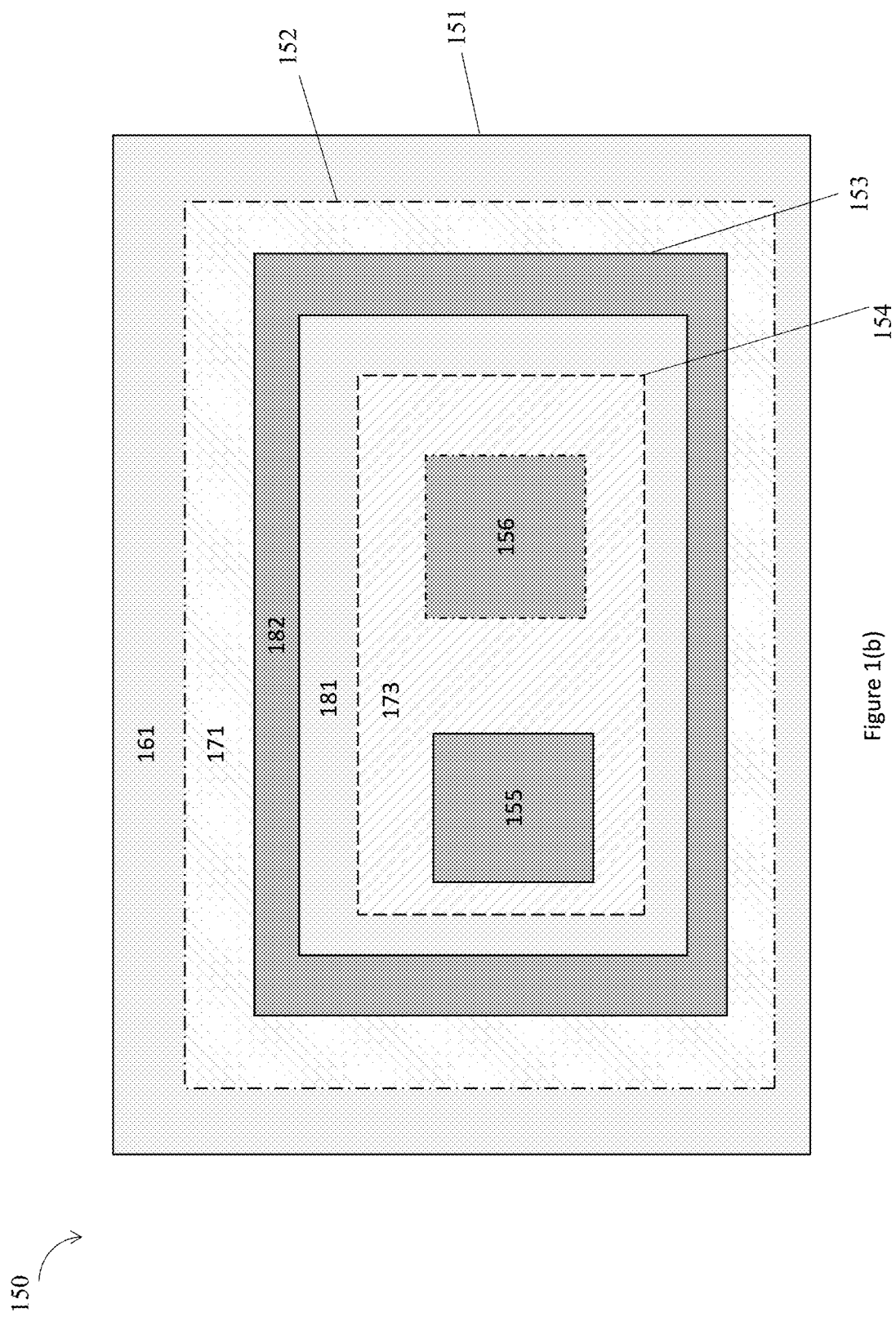

FIGS. 1(a)-1(b) illustrate exemplary thermal energy management apparatus including multiple containers to hold a first liquid coolant separated from a second liquid coolant, in accordance with various embodiments. For example, as shown in FIG. 1(a), a thermal energy management apparatus 100 includes multiple containers, e.g., a first container 101 and a second container 103, to hold a first liquid coolant 121 separated from a second liquid coolant 123. As shown in FIG. 1(b), a thermal energy management apparatus 150 includes multiple containers, e.g., a first container 151 and a second container 153, to hold a first liquid coolant 171 separated from a second liquid coolant 173.

In embodiments, as illustrated in FIG. 1(a), the thermal energy management apparatus 100 includes the first container 101. The first container 101 has one or more cavities including a first cavity 102 formed by a wall 111. The wall 111 may include a first material. The first container 101 includes one or more input inlets in the wall, e.g., an input inlet 113 and an input inlet 115, and one or more output outlets in the wall, e.g., an output outlet 112 and an output outlet 114. In embodiments, the first container 101 has an output outlet, e.g., the output outlet 112 coupled with an external coolant distribution unit (CDU) 107 that is separately fabricated.

In embodiments, the first container 101 is arranged to hold the first liquid coolant 121 within the first cavity 102 to at least partially surround one or more containers including the second container 103. In some embodiments, the second container 103 may be a part of the thermal energy management apparatus 100. In some other embodiments, the second container 103 may not be a part of the thermal energy management apparatus 100 and may be placed within the first container 101 by a different user or party. The first liquid coolant 121, when held in the first container 101, circulates through at least an input inlet, e.g., the input inlet 113, and at least an output outlet, e.g., the output outlet 112. The first liquid coolant 121 may be supplied after the first container 101 has been made, and may be placed into the first container 101 or taken out of the first container 101 by various ways, e.g., by pump.

In embodiments, the second container 103 includes a second cavity 104 formed by a wall 131. The wall 131 may include a second material different from the first material for the wall 111 of the first container 101. For example, the second material in the wall 131 of the second container 103 has a thermal conductivity higher than a thermal conductivity of the first material in the wall 111 of the first container 101. In some embodiments, the second material in the wall 131 of the second container 103 includes silicone polymer, or aluminum metallic.

The second container 103 is configured to hold one or more heat sources, e.g., a heat source 105, within the second cavity 104. The one or more heat sources, e.g., the heat source 105, include a memory unit, a server, a computing unit, or a storage unit. The one or more heat sources, e.g., the heat source 105, include a die having a hydrophilic coating, or a boiling enhancement coating, at a surface of the die. The one or more heat sources, e.g., the heat source 105, may have been surface treated for operating within a liquid coolant.

The second liquid coolant 123 is within the second cavity 104 to at least partially surround the one or more heat sources, e.g., the heat source 105. The second container 103 further includes an input/output (I/O) interface 132, where the second liquid coolant 123 may be placed into the second cavity 104. The I/O interface 132 may be sealed to separate the first liquid coolant 121 from the second liquid coolant 123.

In embodiments, the second liquid coolant 123 has a thermal conductivity higher than a thermal conductivity of the first liquid coolant 121. For example, the first liquid coolant 121 includes water, while the second liquid coolant includes diethyl benzene, dibenzyl toluene, diaryl alkyl, partially hydrogenated terphenyl, or a cooling dielectric fluid. When the second liquid coolant 123 has a thermal conductivity higher than a thermal conductivity of the first liquid coolant 121, the second liquid coolant 123 is more efficient to capture the heat generated by the heat source 105. However, the second liquid coolant 123 may be more expensive than the first liquid coolant 121. By using two different liquid coolants with different thermal conductivity and different cost, the thermal energy management apparatus 100 has the benefit of the immersion cooling technology but with reduced cost and modular designs. Hence, the thermal energy management apparatus 100 is an improvement over the traditional immersion cooling technology.

In embodiments, the second container 103 includes a wave generator 133 to generate closed and forced circulation wave of the second liquid coolant 123 to circulate within the second container 103. The wave generator 133 may include a piezo diaphragm actuator, pneumatic actuation (pressurized air), or a liquid cooled pump. Therefore, the second liquid coolant 123 is to circulate within the second container 103 in closed and forced circulation, while the first liquid coolant 121 circulates through the input inlet 113 and the output outlet 112. In embodiments, the second container 103 includes a mechanical vibration unit 135 to change vibration frequency to prevent contaminant build up on the second container 103.

In embodiments, the thermal energy management apparatus 100 may include a mechanical supporting system 134 to support the one or more containers, e.g., the second container 103, or the one or more heat sources, e.g., the heat source 105. The mechanical supporting system 134 may include a rack rail with a slider mounting mechanism, a 3-axis suspension system, or wire mesh stiffener structure.

FIG. 1(a) only illustrates the main concepts of the components of the thermal energy management apparatus 100. A person having ordinary skill in the art can see that there may be many details, additional components not shown in FIG. 1(a) for the thermal energy management apparatus 100. Some more details of similar thermal energy management apparatuses may be shown in other figures in the current disclosure.

In embodiments, FIG. 1(a) only shows two containers, the first container 101 and the second container 103 within the first container 101, for the thermal energy management apparatus 100. In some other embodiments, the thermal energy management apparatus 100 may have more containers contained within each other. For example, there may be a third container within the first container 101, and the second container 103 is within the third container. In other words, a third container may be placed within the first cavity 102 of the first container 101, with the first liquid coolant 121 at least partially surrounding the third container. The third container includes a third cavity, and a third liquid coolant within the third cavity to at least partially surround the second container 103 that is placed within the third cavity of the third container.

Figure 10A:
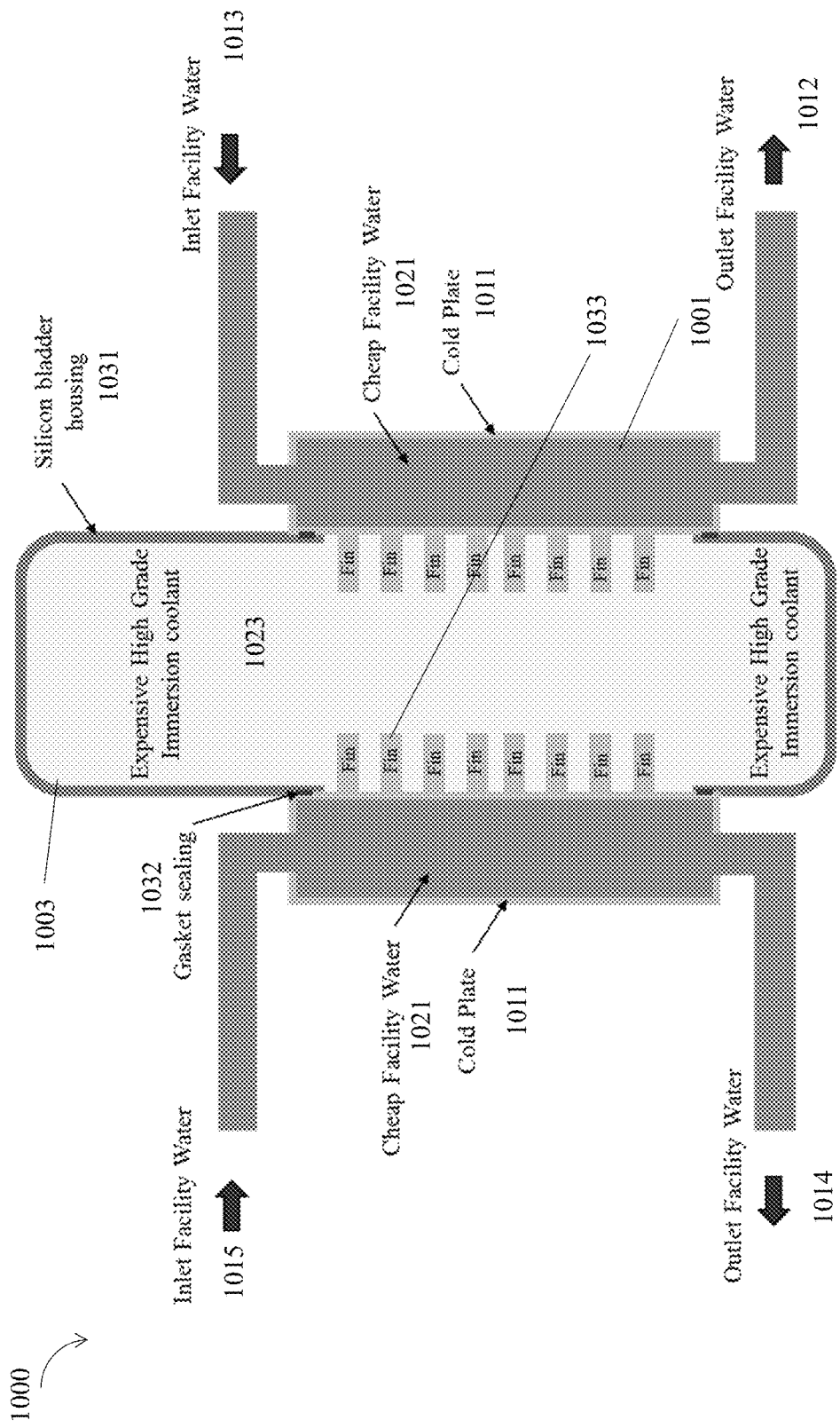
FIGS. 10(a)-10(b) illustrate another immersion cooling system including multiple containers to hold a first liquid coolant separated from a second liquid coolant, in accordance with various embodiments.

In embodiments, there may be other designs for the first container 101 and the second container 103, different from the ones shown in FIG. 1(a). For example, at least one or more parts of the wall of the first container may be shared with the second container. A part of the one or more parts of the wall of the first container shared with the second container may include a cold plate, and the at least one or more parts of the wall of the first container shared with the second container includes one or more fins. More details of such shared part of the first container and the second container may be found in FIGS. 10(a)-10(b).

FIG. 1(b) further illustrates the thermal energy management apparatus 150 includes multiple containers, e.g., the first container 151 and the second container 153, to hold the first liquid coolant 171 separated from the second liquid coolant 173. The thermal energy management apparatus 150, the first container 151, the second container 153, the first liquid coolant 171, and the second liquid coolant 173, may have many features similar to the features of the thermal energy management apparatus 100, the first container 101, the second container 103, the first liquid coolant 121, and the second liquid coolant 123 as shown in FIG. 1(a).

In embodiments, the thermal energy management apparatus 150 includes the first container 151. The first container 151 has one or more cavities including a first cavity 152 formed by a wall 161. The wall 161 may include a first material. The first container 151 is arranged to hold the first liquid coolant 171 within the first cavity 152 to at least partially surround one or more containers including the second container 153. The second container 153 includes a second cavity 154 formed by a wall 181 and a wall 182, where the wall 181 and the wall 182 includes different materials. For example, the material in the wall 181 of the second container 153 has a thermal conductivity higher than a thermal conductivity of the material in the wall 182 of the second container 153. In addition, both materials of the wall 181 and the wall 182 have a thermal conductivity higher than a thermal conductivity of the material in the wall 161 of the first container 151. The second container 153 is configured to hold multiple heat sources, e.g., a heat source 155, a heat source 156, within the second cavity 154. The second liquid coolant 173 is within the second cavity 154 to at least partially surround the heat source 155 and the heat source 156. In embodiments, the second liquid coolant 173 has a thermal conductivity higher than a thermal conductivity of the first liquid coolant 171.

Figure 2:
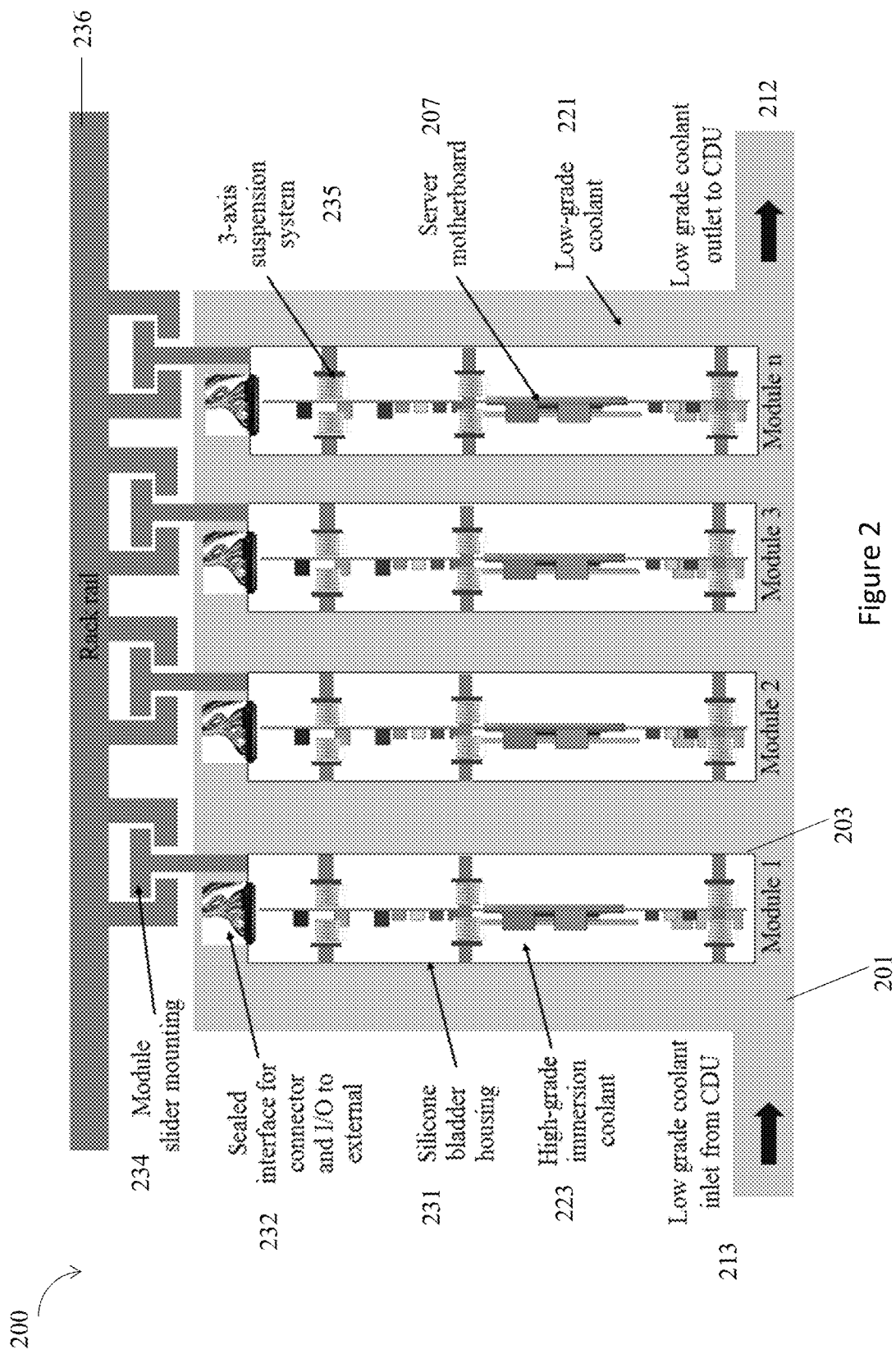
FIG. 2 illustrates an immersion cooling system including multiple containers to hold a first liquid coolant separated from a second liquid coolant, in accordance with various embodiments.

FIG. 2 illustrates an immersion cooling system 200 including multiple containers, e.g., a first container 201, a second container 203, to hold a first liquid coolant 221 separated from a second liquid coolant 223, in accordance with various embodiments. In embodiments, the immersion cooling system 200, the first container 201, the second container 203, the first liquid coolant 221, and the second liquid coolant 223, may be examples of the thermal energy management apparatus 100, the first container 101, the second container 103, the first liquid coolant 121, and the second liquid coolant 123 as shown in FIG. 1(a).

In embodiments, the immersion cooling system 200 includes the first container 201. The first container 201 is arranged to hold the first liquid coolant 221 to surround 4 containers including the second container 203. There are four of the same kind of second container 203 included within the first container 201. Therefore, the immersion cooling system 200 is a modular system with multiple same second containers. The first container 201 has an input inlet 213 and an output outlet 212. The second container, e.g., the second container 203, includes a silicon bladder housing 231. A heat source, e.g., a server motherboard, 207, is placed in the second container, e.g., the second container 203. A second container, e.g., the second container 203, includes an I/O interface 232. The immersion cooling system 200 also includes various components for a mechanical supporting system, e.g., a rack rail 236 with a slider mounting mechanism 234, and a 3-axis suspension system 235.

Figure 3:
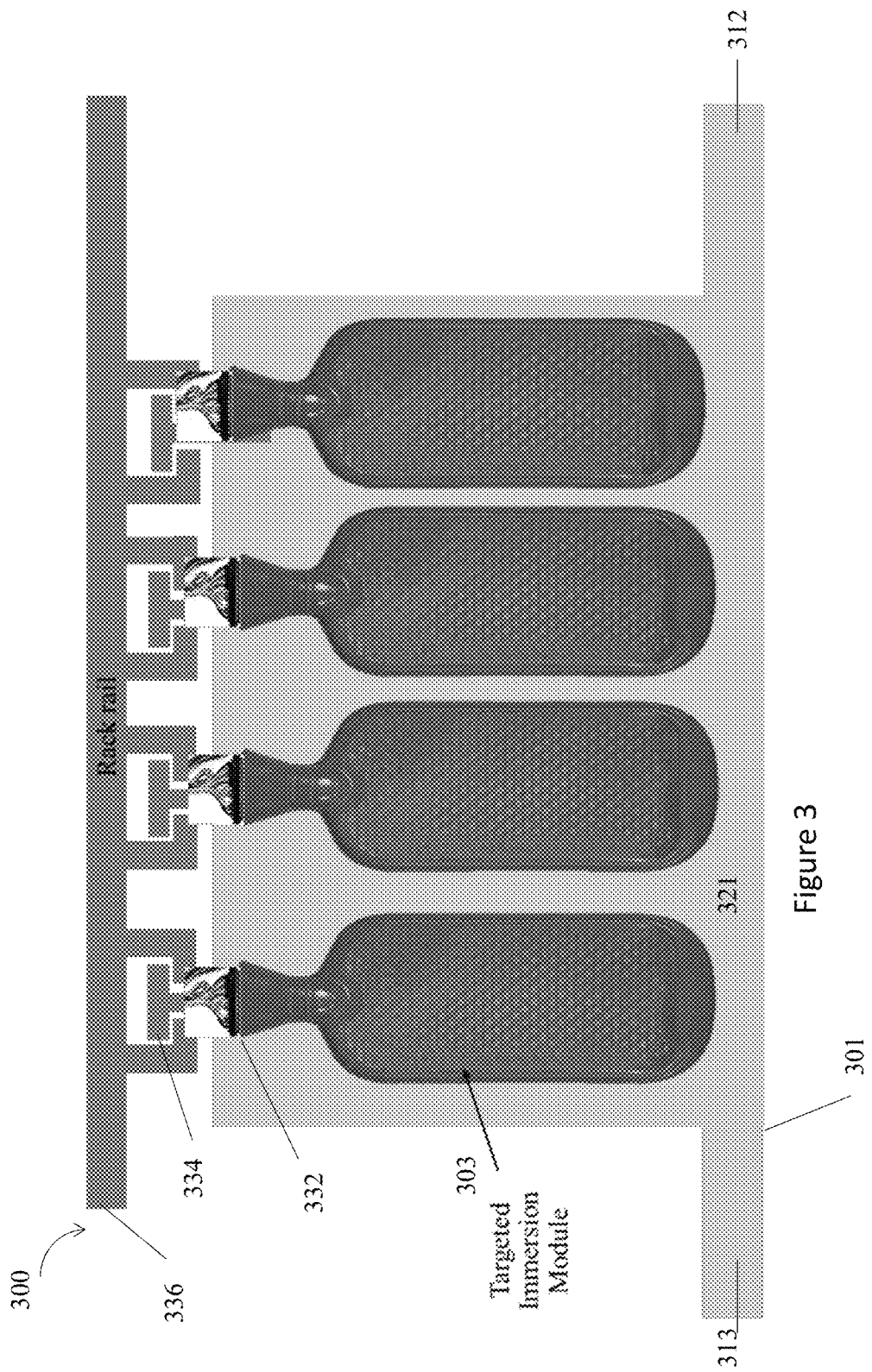
FIG. 3 illustrates another immersion cooling system including multiple containers to hold a first liquid coolant separated from a second liquid coolant, in accordance with various embodiments.

FIG. 3 illustrates an immersion cooling system 300 including multiple containers, e.g., a first container 301, a second container 303, to hold a first liquid coolant 321 separated from a second liquid coolant, in accordance with various embodiments. In embodiments, the immersion cooling system 300, the first container 301, the second container 303, the first liquid coolant 321, and the second liquid coolant within the second container 303, may be examples of the thermal energy management apparatus 100, the first container 101, the second container 103, the first liquid coolant 121, and the second liquid coolant 123 as shown in FIG. 1(a).

In embodiments, the immersion cooling system 300 includes the first container 301. The first container 301 is arranged to hold the first liquid coolant 321 to surround 4 containers including the second container 303. There are four of the same kind of second container 303 included within the first container 301. Therefore, the immersion cooling system 300 is a modular system with multiple same second containers. The first container 301 has an input inlet 313 and an output outlet 312. The second container, e.g., the second container 303, includes a silicon bladder housing that is a flexible container, where a shape, size, and form factor of the second container 303 is changeable. A heat source may be placed in the second container, not shown. A second container, e.g., the second container 303, includes an I/O interface 332. The I/O interface 332 includes a mechanical vibration unit to change vibration frequency to prevent contaminant build up on the second container 303. The immersion cooling system 300 also includes various components for a mechanical supporting system, e.g., a rack rail 336 with a slider mounting mechanism 334.

Figure 4:
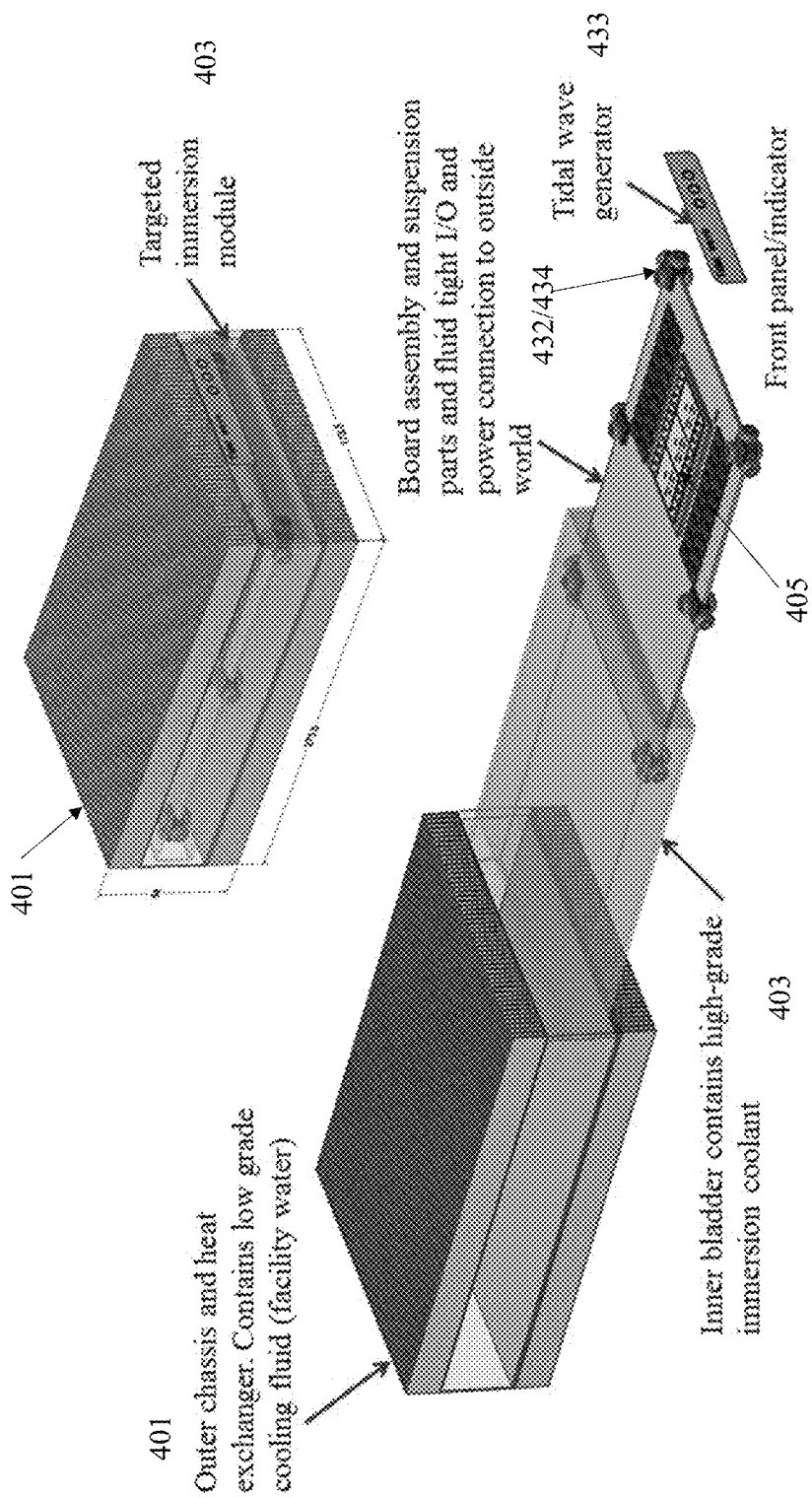
FIG. 4 illustrates another immersion cooling system including multiple containers to hold a first liquid coolant separated from a second liquid coolant, in accordance with various embodiments.

FIG. 4 illustrates an immersion cooling system 400 including multiple containers, e.g., a first container 401, a second container 403, to hold a first liquid coolant separated from a second liquid coolant, in accordance with various embodiments. In embodiments, the immersion cooling system 400, the first container 401, the second container 403, the first liquid coolant within the first container 401, and the second liquid coolant within the second container 403, may be examples of the thermal energy management apparatus 100, the first container 101, the second container 103, the first liquid coolant 121, and the second liquid coolant 123 as shown in FIG. 1(*a*).

In embodiments, the immersion cooling system 400 includes the first container 401, which is an outer chassis and heat exchanger. The first container 401 is of a rectangular cuboid shape. The first container 401 is arranged to hold the first liquid coolant to surround the second container 403. The second container 403 is also of a rectangular cuboid shape and may occupy one slot of the first container 401. A heat source 405 may be placed in the second container 403. The second container 403 includes an I/O interface 432 and a mechanical supporting part 434 that includes a board assembly and suspension part. The second container 403 further includes a wave generator 433 to generate closed and forced circulation wave of the second liquid coolant to circulate within the second container 403.

Figure 5:
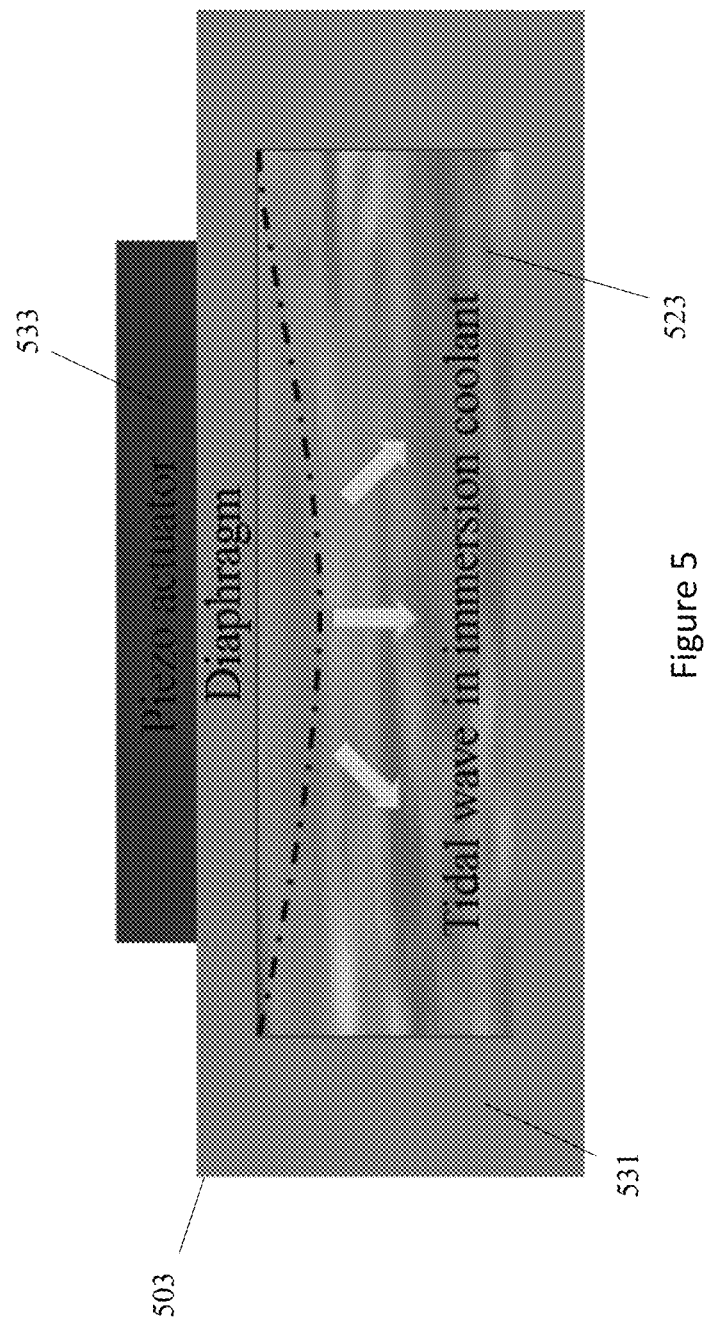
FIG. 5 illustrates a wave generator to generate closed and forced circulation wave of the second liquid coolant to circulate within the second container, in accordance with various embodiments.

FIG. 5 illustrates a wave generator 533 to generate closed and forced circulation wave of the second liquid coolant 523 to circulate within the second container 503, in accordance with various embodiments. In embodiments, the wave generator 533, the second liquid coolant 523, and the second container 503 may be examples of the wave generator 133, the second liquid coolant 123, and the second container 103, as shown in FIG. 1(*a*). In addition, the wave generator 533, the second liquid coolant 523, and the second container 503 may be examples of the wave generator 433, the second liquid coolant within the second container 403, and the second container 403, as shown in FIG. 4. The second container 503 includes a wall 531, and the wave generator 533 is mounted on an outer surface of the wall 531 of the second container 503.

Figure 6:
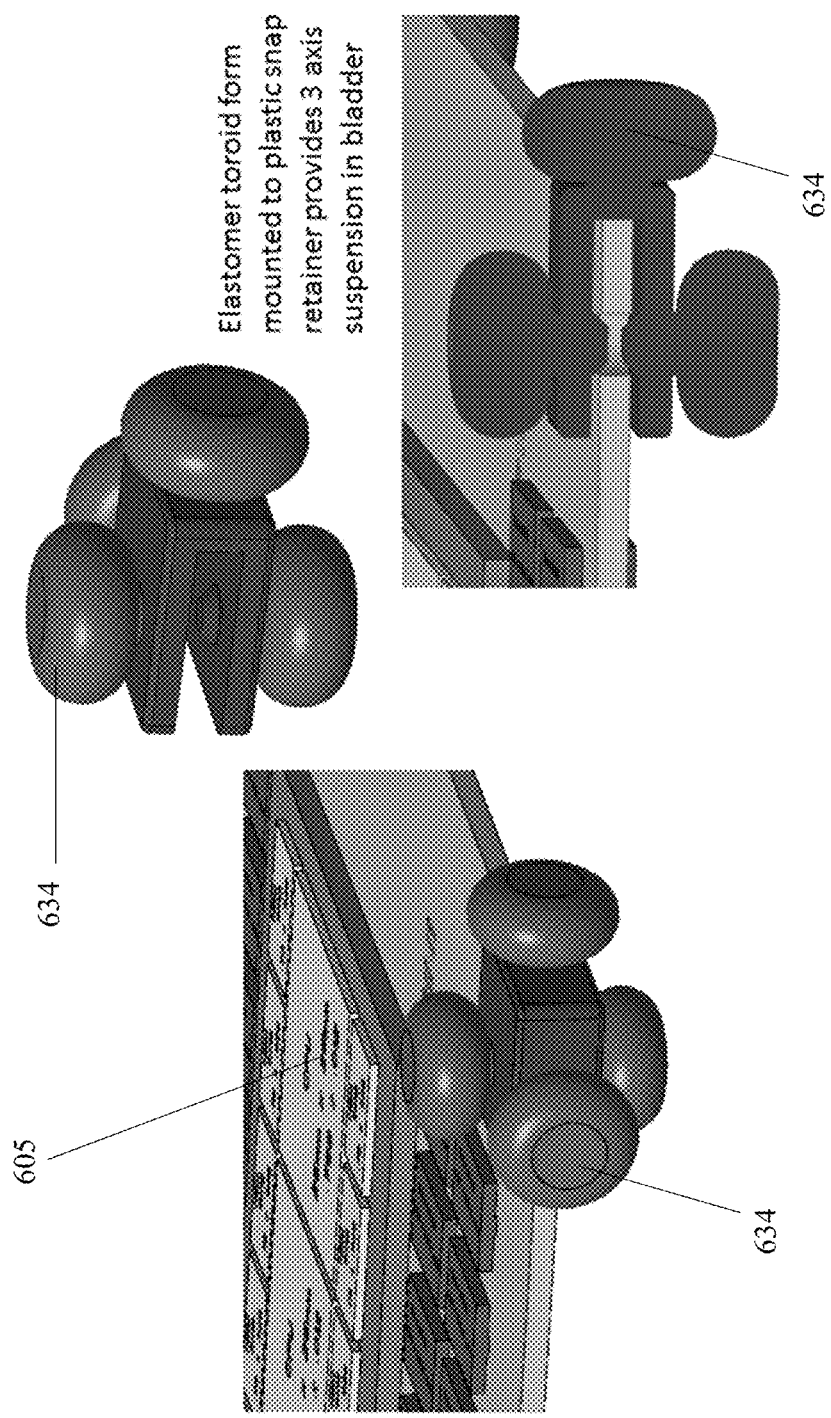
FIG. 6 illustrates a mechanical supporting system to support one or more heat sources, in accordance with various embodiments.

FIG. 6 illustrates a mechanical supporting system 634 to support one or more heat sources, e.g., a heat source 605, in accordance with various embodiments. The disk like mechanical supporting system 634 and the heat source 605 are examples of the mechanical supporting part 434 and the heat source 405 as shown in FIG. 4.

Figure 7:
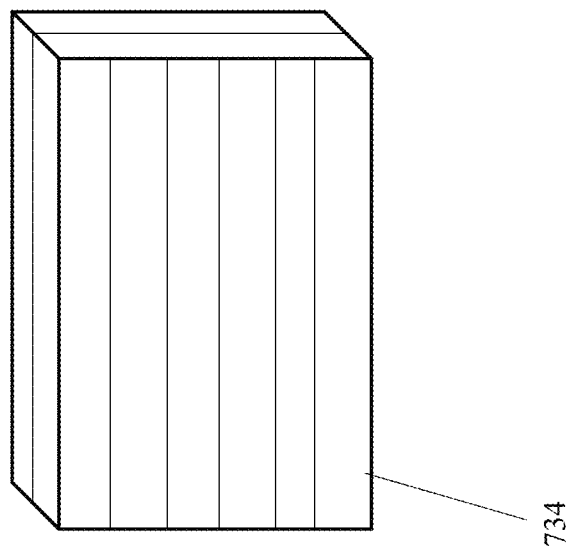
FIG. 7 illustrates another mechanical supporting system to support the one or more containers, in accordance with various embodiments.

FIG. 7 illustrates another mechanical supporting system 734 to support the one or more containers, in accordance with various embodiments. The mechanical supporting system 734 is a wire mesh retainer structure that can house a silicone bladder, e.g., the second container 303 as shown in FIG. 3.

Figure 8:
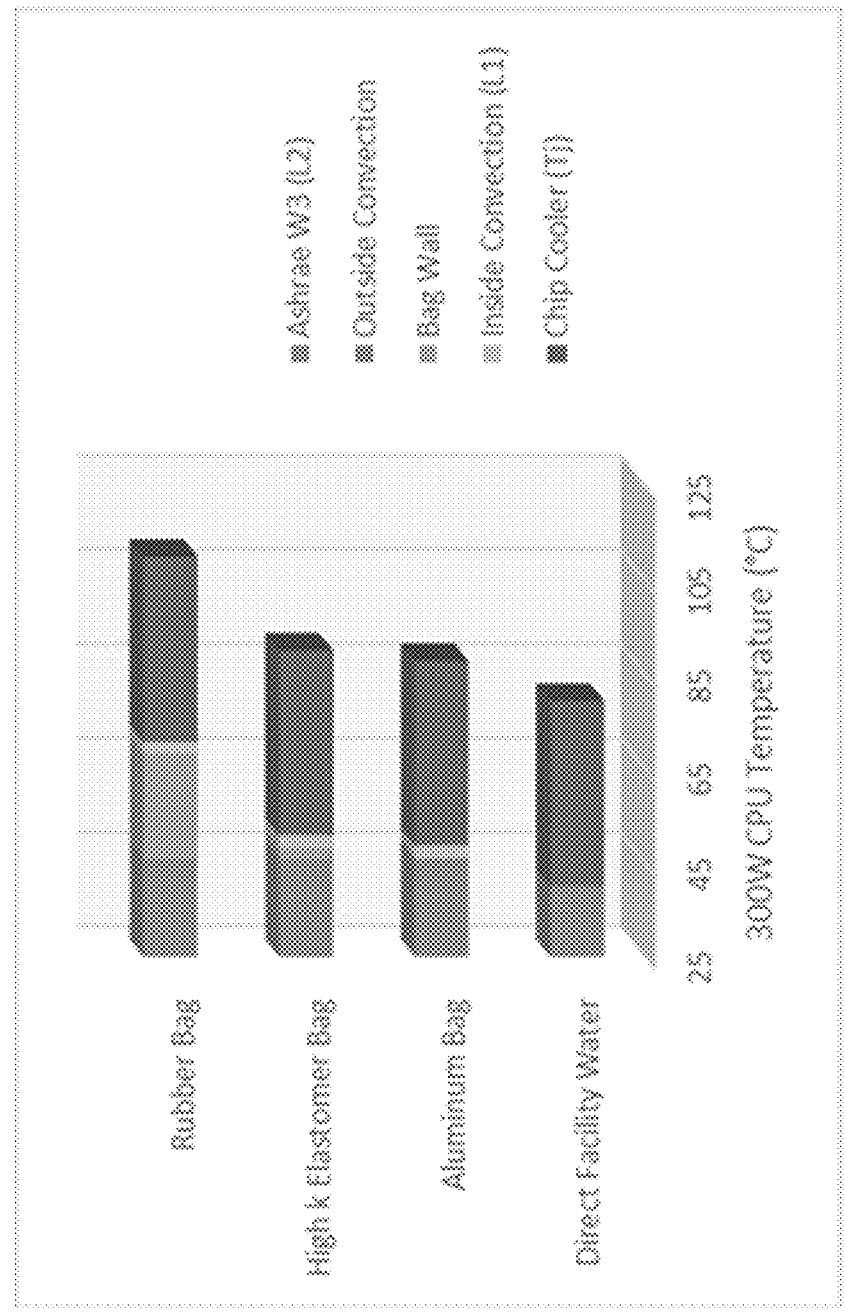
FIG. 8 illustrates thermal analysis comparison of silicon rubber bladder as a second container within a first container, in accordance with various embodiments.

FIG. 8 illustrates thermal analysis comparison of silicon rubber bladder as a second container within a first container, in accordance with various embodiments.

In embodiments, when a silicon rubber bladder is used as a second container, e.g., the second container 303 as shown in FIG. 3, the silicon rubber bladder incurs a cooling penalty. FIG. 8 shows an analysis for a 1 kW 1 U half width board, with a 300 W CPU. Various second container have been studied, including a 0.1" thick silicon rubber bladder with conductivity k=0.3 W/mK, a high conductivity elastomer bag with k=3 W/mK, and a 0.5 mm thick aluminum bag with k=220 W/mK. It can be observed that the cooling penalty of a silicon rubber bladder is highly dependent on the thickness and conductivity of the silicon rubber bladder. As long as the bag material and thickness of the silicon rubber bladder are carefully chosen, the silicon rubber bladder can be used to cool a 300 W CPU in the 1 U half width form factor delivering a significant boost over air cooling.

Figure 9A:
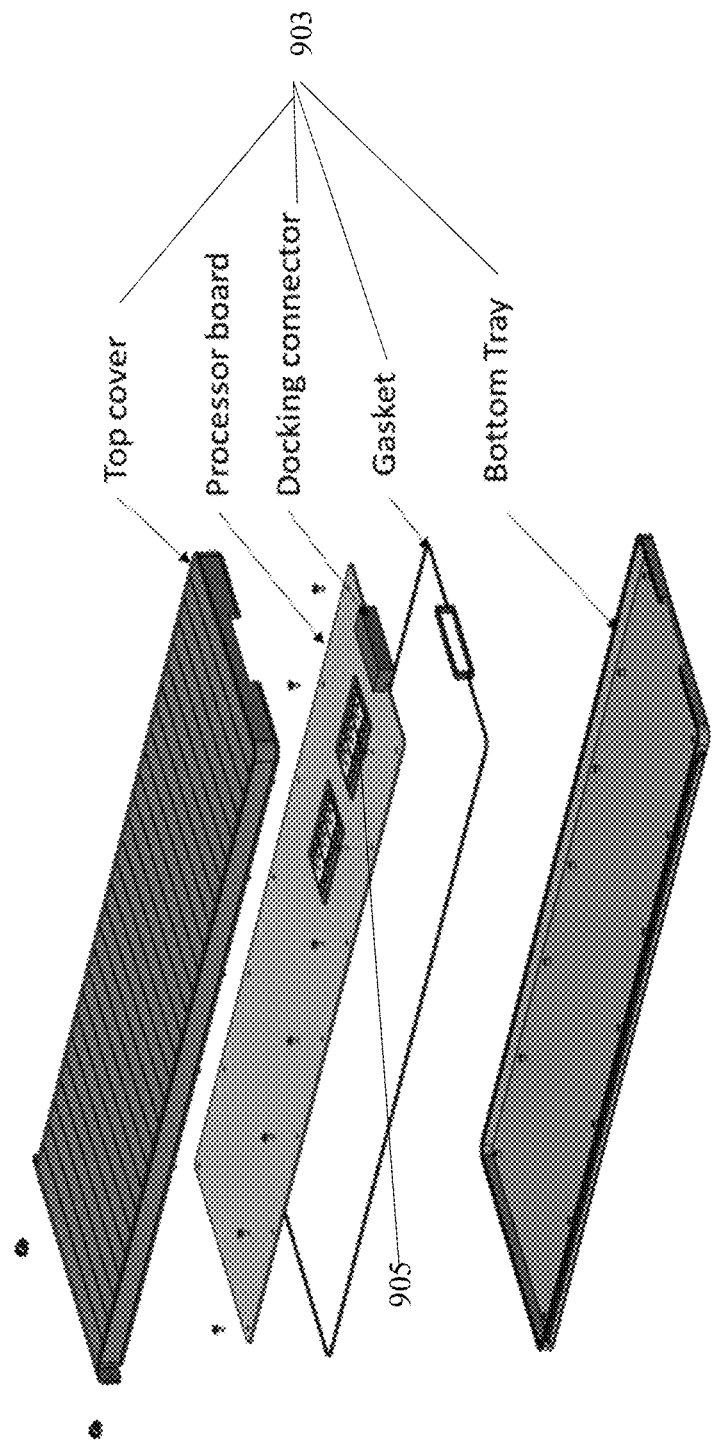
FIGS. 9(a)-9(b) illustrates an aluminum bladder as a second container within a first container, in accordance with various embodiments.
Figure 9B:
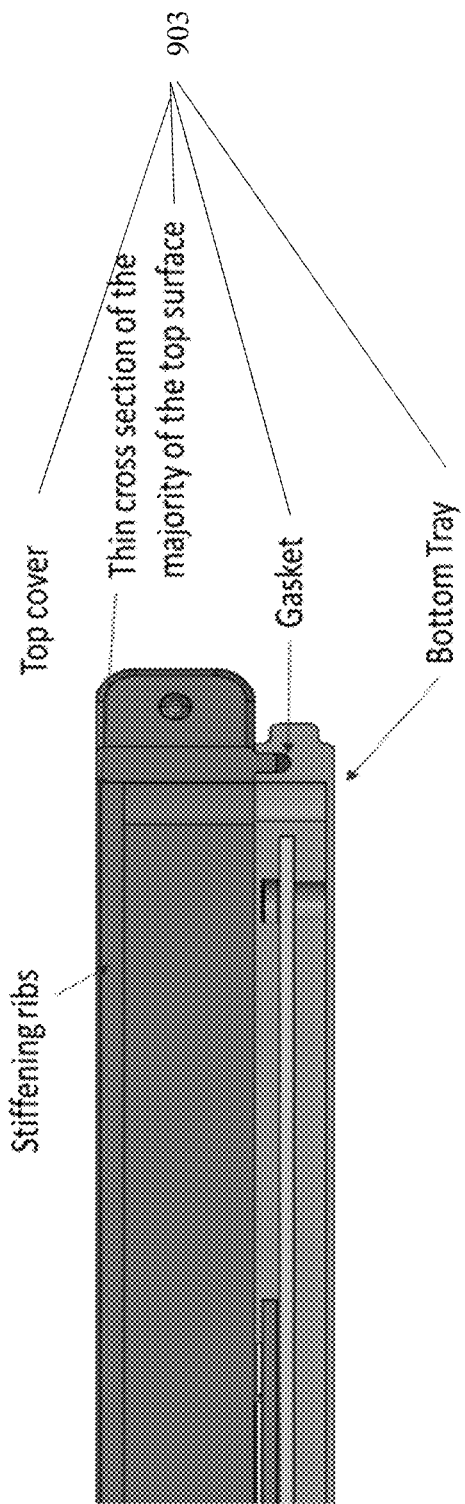

FIGS. 9(*a*)-9(*b*) illustrates an aluminum bladder 903 as a second container within a first container, in accordance with various embodiments. In embodiments, the aluminum bladder 903 may be examples of the second container 103, as shown in FIG. 1(*a*). FIG. 9(*a*) shows a top view and FIG. 9(*b*) shows a cross sectional view of the aluminum bladder 903.

In embodiments, the aluminum bladder 903 includes a top cover, a gasket, a bottom tray, a docking connector, a stiffening rib, and a processor board to host a heat source 905, which may be a processor board. The processor board is enclosed in an immersion cooled chamber formed by the top cover and the bottom tray with a gasket sealing in between. The top cover and bottom tray can be manufactured of aluminum by deep drawing methods similar to what is used to manufacture commercially available Coke cans.

FIGS. 10(*a*)-10(*b*) illustrate another immersion cooling system including multiple containers to hold a first liquid coolant separated from a second liquid coolant, in accordance with various embodiments. FIG. 10(*a*) illustrates an immersion cooling system 1000 including a first container 1001 to hold a first liquid coolant 1021 separated from a second liquid coolant 1023 held in a second container 1003. In embodiments, the immersion cooling system 1000, the first container 1001, the second container 1003, the first liquid coolant 1021, and the second liquid coolant 1023, may be examples of the thermal energy management apparatus 100, the first container 101, the second container 103, the first liquid coolant 121, and the second liquid coolant 123 as shown in FIG. 1(*a*). FIG. 10(*b*) illustrates an immersion cooling system 1050 including a first container 1051 to hold a first liquid coolant 1071 separated from a second liquid coolant 1073 held in a second container 1053. In embodiments, the immersion cooling system 1050, the first container 1051, the second container 1053, the first liquid coolant 1071, and the second liquid coolant 1073, may be examples of the thermal energy management apparatus 100, the first container 101, the second container 103, the first liquid coolant 121, and the second liquid coolant 123 as shown in FIG. 1(*a*).

In embodiments, as shown in FIG. 10(*a*), the immersion cooling system 1000 includes the first container 1001 having a wall 1011, and the second container 1003 having a wall 1031. The wall 1011 includes a cold plate. The wall 1031 for the second container 1003 includes a silicon bladder housing as a first part, and the cold plate part shared with the wall 1011. In addition, the wall 1011 and the wall 1031 also include one or more fins 1033. The fins 1033 can extend the surface area shared between the first container 1001 and the second container 1003, hence improving the efficiency of thermal energy management.

In embodiments, the first container 1001 has two cavities formed on both sides of the second container 1003. The first container 1001 is arranged to hold the first liquid coolant 1021 to be placed in the two cavities to surround a part of the second container 1003. The second container 1003 is arranged to hold the second liquid coolant 1023. The second container 1003 also includes an I/O interface 1032, which is a gasket sealing, to separate the first liquid coolant 1021 and the second liquid coolant 1023. A heat source may be placed in the second container 1003. The first container 1001 includes an input inlet 1013 and an output outlet 1012 coupled to one cavity, and an input inlet 1015 and an output outlet 1014 coupled to another cavity. The input inlet 1013, the output outlet 1012, the input inlet 1015, and the output outlet 1014 may be coupled to an external CDU so that the first liquid coolant 1021 can circulates through the input inlets and the output outlets.

Figure 10B:
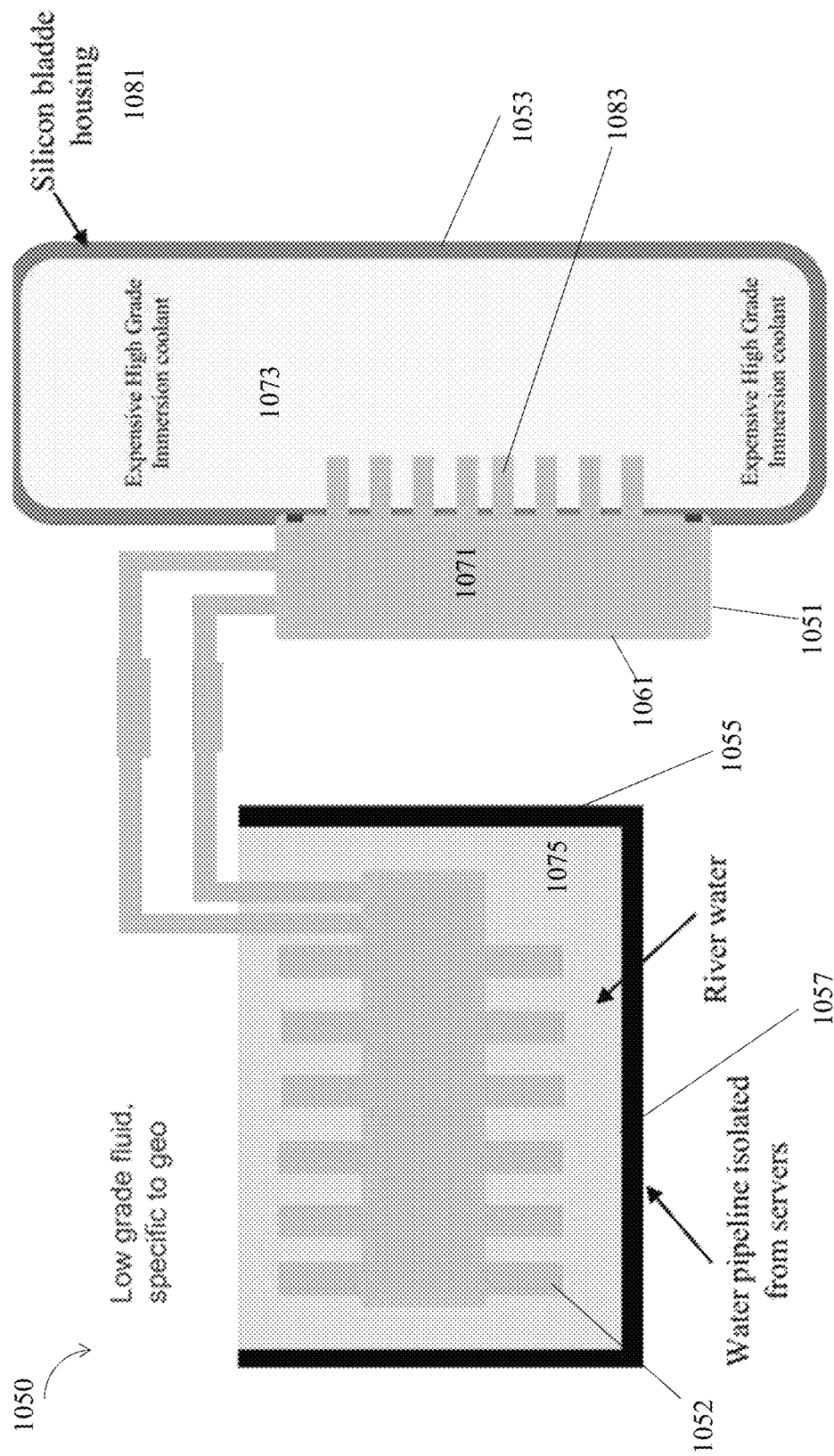

In embodiments, as shown in FIG. 10(b), the immersion cooling system 1500 includes the first container 1051 having a wall 1061, and the second container 1053 having a wall 1081. The wall 1061 includes a cold plate. The wall 1081 for the second container 1053 includes a silicon bladder housing as a first part, and the cold plate part shared with the wall 1061. In addition, the wall 1061 and the wall 1081 also include one or more fins 1083. The fins 1083 can extend the surface area shared between the first container 1051 and the second container 1053, hence improving the efficiency of thermal energy management.

In embodiments, the first container 1051 has a cavity formed on one side of the second container 1053. There may be another cavity formed on another side of the second container 1053, not shown. In addition, the first container 1051 may be extended to have a second part 1052, which is placed in a third container 1055. The first container 1051 is arranged to hold the first liquid coolant 1071 to be placed in the cavity to surround a part of the second container 1053. The second container 1053 is arranged to hold the second liquid coolant 1073. A heat source may be placed in the second container 1053, not shown. In addition, the third container 1055 includes a third liquid coolant 1075, which may be contained by a wall 1057 of the third container 1055.

Figure 11A:
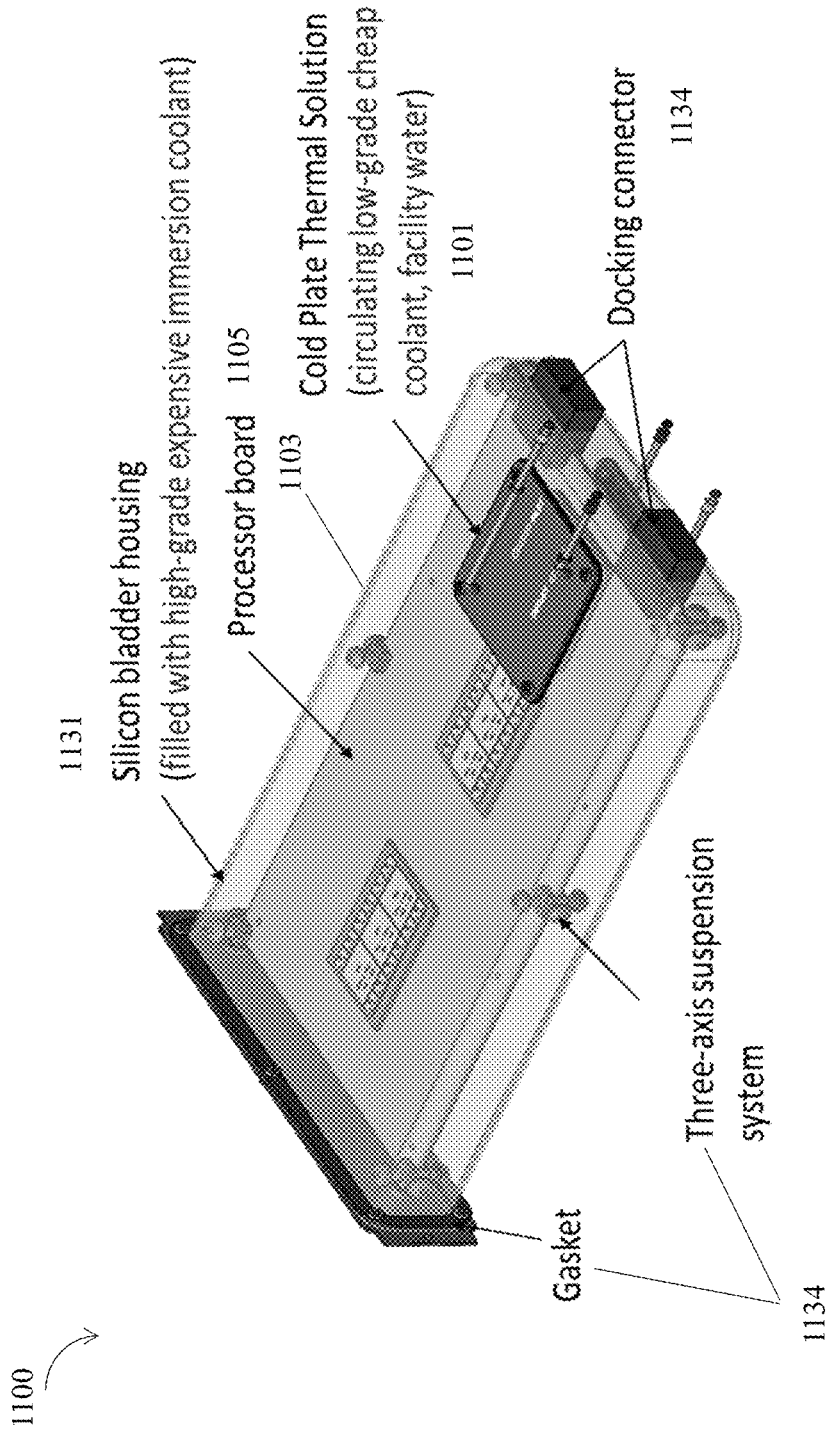
FIGS. 11(a)-11(c) illustrate another immersion cooling system including multiple containers to hold a first liquid coolant separated from a second liquid coolant, in accordance with various embodiments.
Figure 11B:
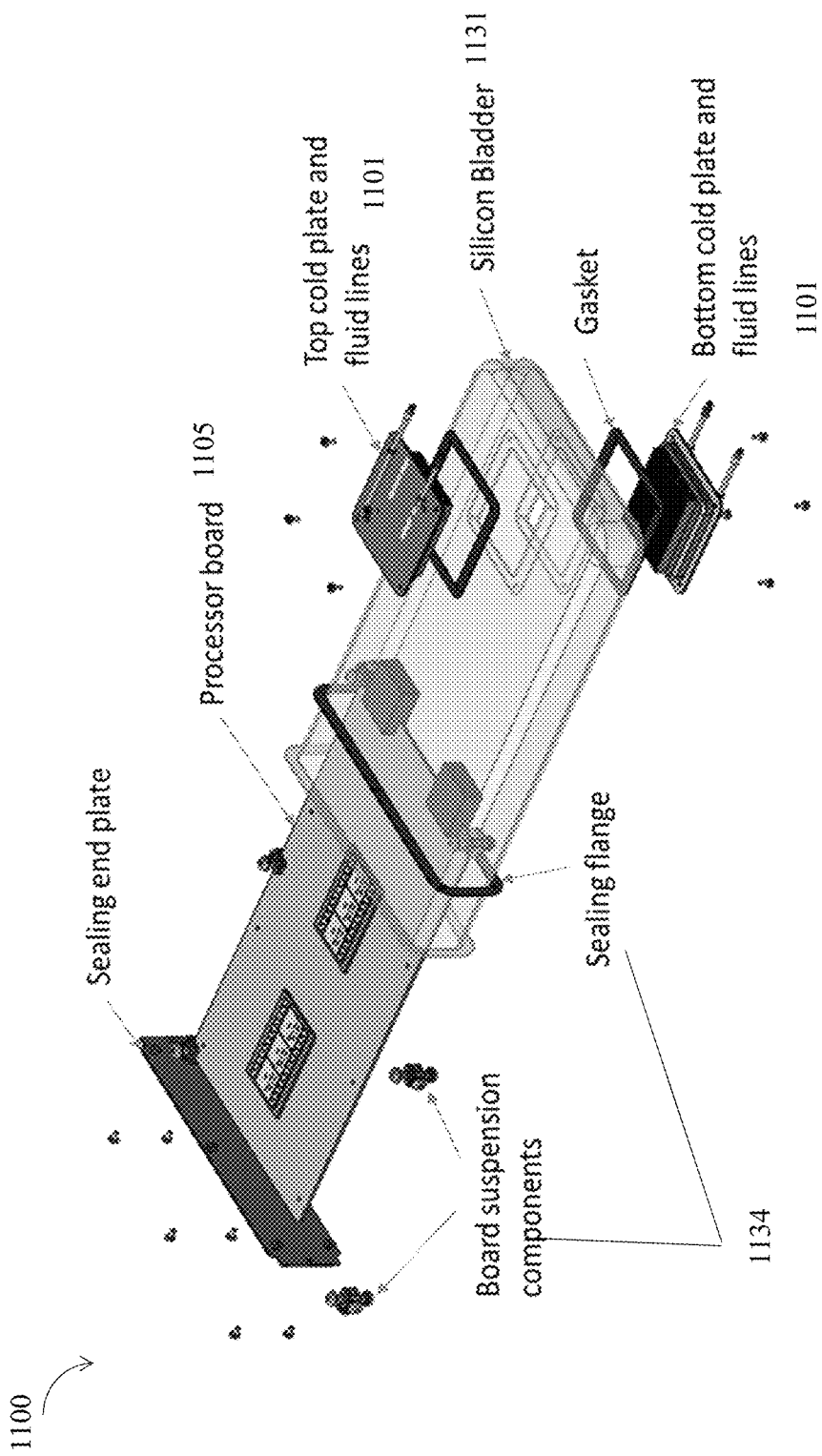
Figure 11C:
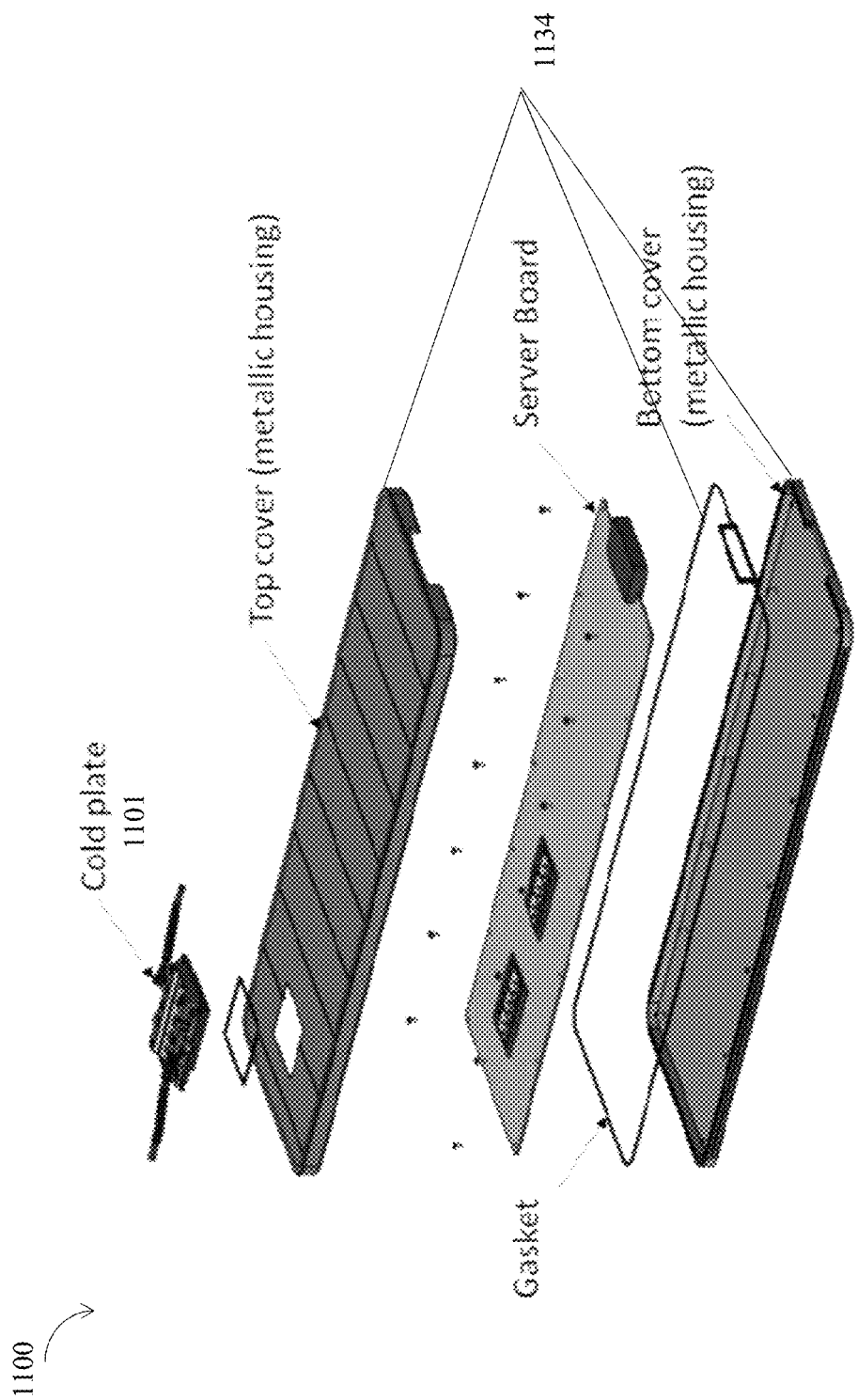

FIGS. 11(a)-11(c) illustrate another immersion cooling system 1100 including multiple containers, e.g., a first container 1101 and a second container 1103, to hold a first liquid coolant separated from a second liquid coolant, in accordance with various embodiments. In embodiments, the immersion cooling system 1100, the first container 1101, the second container 1103, the first liquid coolant held in the first container 1101, and the second liquid coolant held in the second container 1103, may share features with the thermal energy management apparatus 100, the first container 101, the second container 103, the first liquid coolant 121, and the second liquid coolant 123 as shown in FIG. 1(a). However, the second container 1103 is not placed within a cavity of the first container 1101. Instead, the first container 1101 and the second container 1103 share a part of the wall.

In embodiments, as shown in FIG. 11(a), the first container 1101 is a cold plate thermal solution to circulate first liquid coolant that is low grade and cheaper. The second container 1103 includes a wall 1131 that is silicon bladder housing, and may be filled with a second liquid coolant that is high grade and more expensive. A heat source 1105, e.g., a processor board, may be placed within the second container 1103. The immersion cooling system 1100 further includes a mechanical supporting system 1134 to support the one or more containers including the second container, or the one or more heat sources, e.g., a gasket, a three-axis suspension system, a docking connector, a sealing flange, a sealing end plate, a top cover, and a bottom cover, as shown in FIGS. 11(a)-11(c).

FIGS. 12(a)-12(b) illustrate an exemplary mechanical supporting system 1234, which may be used to place a heat source, in accordance with various embodiments. In embodiments, the hinge like mechanical supporting system 1234 may be an example of the mechanical supporting system 134 as shown in FIG. 1(a). A heat source, e.g., a server, may be placed within the hinge like mechanical supporting system 1234, which in turn may be coupled to circuit boards on either side. FIG. 12(a) shows the closed view of the mechanical supporting system 1234, and FIG. 12(b) shows the open view of the mechanical supporting system 1234.

In embodiments, the mechanical supporting system 1234 may be an immersion pod, which may use a high-density mechanical and electrical butterfly "hinge". The immersion pod may integrate heat spreader package that reduces volume and mass vs. air cooling heatsink. The heat spreader may further enable high-density asymmetry board design for more memory, component density. The immersion pod may include a stiffener structure to mount board on both sides for immersion module, an easily removable and detachable hinge joint, springs between two plated under closed condition for shock and vibe; and hooks for pulling out from container and module. The immersion pod may be have easy assembly, removal, and serviceability FIG. 13 illustrates another exemplary second container 1303 to contain multiple heat sources, in accordance with various embodiments. In embodiments, the second container 1303 may be an example of the second container 103 as shown in FIG. 1(a). As shown in FIG. 13, multiple mechanical supporting systems 1334 may be placed or nested within the second container 1303, and surrounded by a second liquid coolant 1323. A mechanical supporting system 1334 may be an example of the mechanical supporting system 1234 as shown in FIGS. 12(a)-12(b). One or more heat sources may be placed within a mechanical supporting system 1334.

Figure 14B:
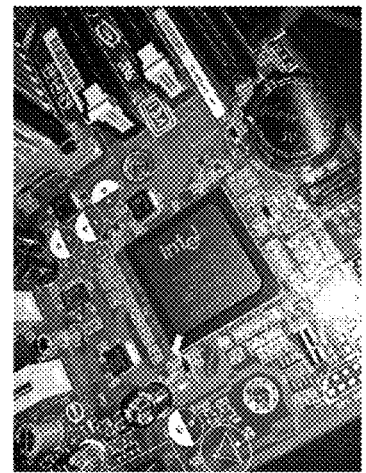
FIGS. 14(a)-14(b) illustrate exemplary heat sources with treated surface for operating within a liquid coolant, in accordance with various embodiments.
Figure 14A:
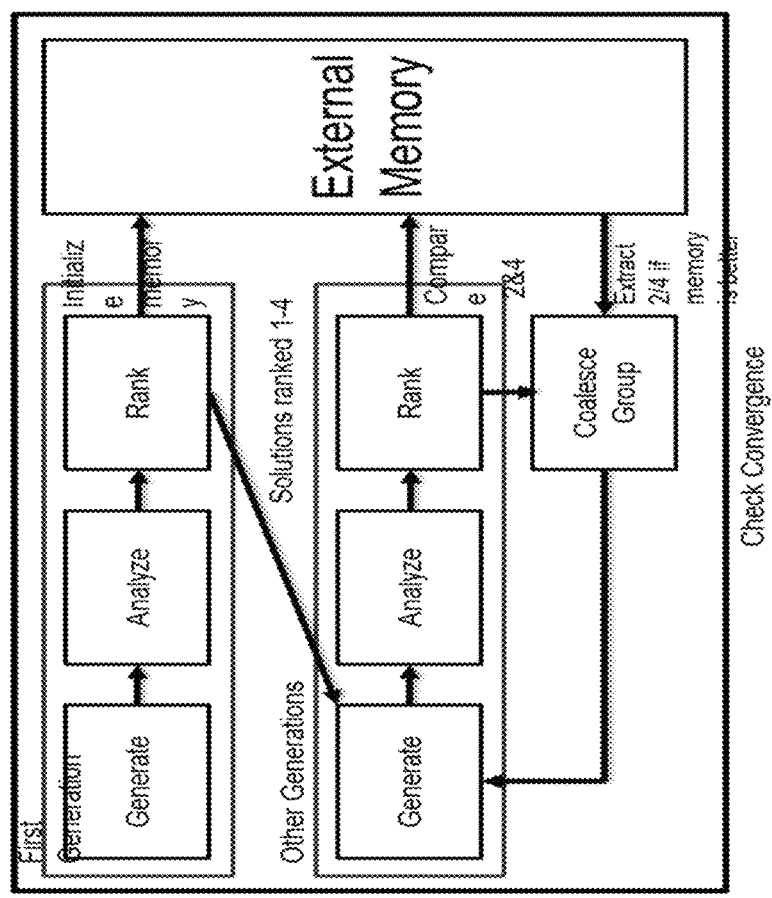

FIGS. 14(a)-14(b) illustrate exemplary heat sources, e.g., heat source 1405, with treated surface for operating within a liquid coolant, in accordance with various embodiments. In embodiments, the heat source 1405 may be an example of the heat source 105 as shown in FIG. 1(a).

In embodiments, the heat source 1405 may be designed to have a surface to improve heat exchange, and have been surface treated for operating within the second liquid coolant. The improvement of the surface design may be aided by machine learning genetic algorithms, as shown in FIG. 14(a). For example, a machine learning genetic algorithm may be used to improve a heat spreader geometry at the surface of the heat source 1405, to improve three dimensional manufacture technology for the heat source 1405, to perform laminate compression printing on the surface of the heat source 1405.

Figure 15B:
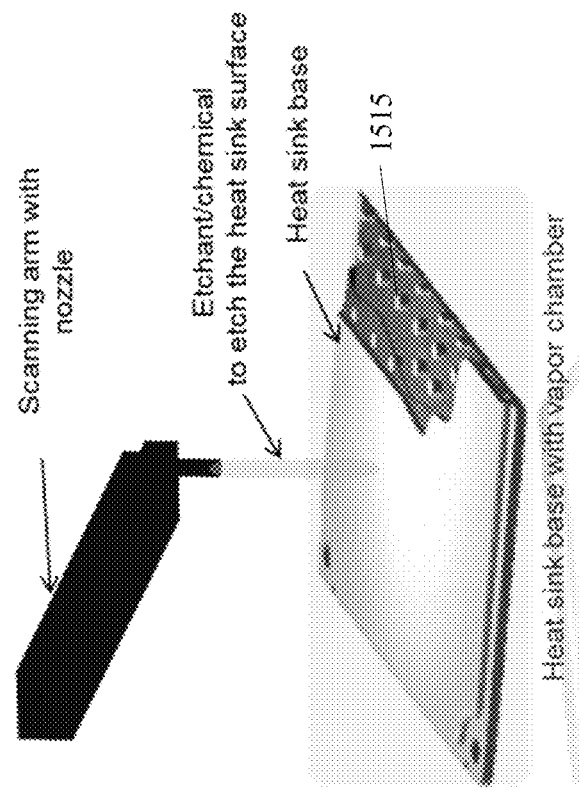
FIGS. 15(a)-15(b) illustrate exemplary heat sinks having a coating layer on a surface for operating within a liquid coolant, in accordance with various embodiments.
Figure 15A:
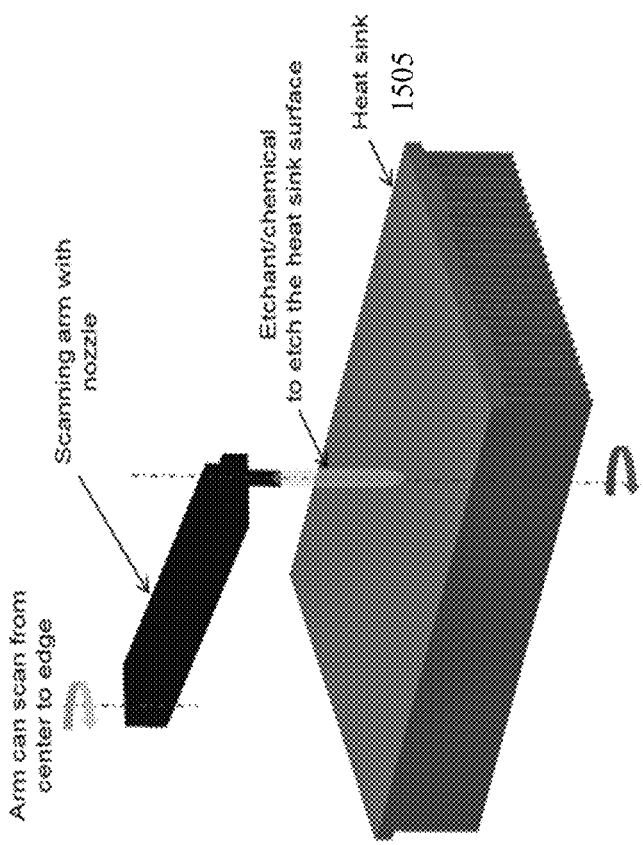

FIGS. 15(a)-15(b) illustrate exemplary heat sources or sinks, e.g., a heat sink 1505, and a heat sink 1515, having a coating layer on a surface for operating within a liquid coolant, in accordance with various embodiments. In embodiments, the heat sink 1505 and the heat sink 1515 may be an example of the heat source 105 as shown in FIG. 1(a).

In embodiments, the heat sink 1505 and the heat sink 1515 may include a die having a hydrophilic coating, or a boiling enhancement coating, at a surface of the die. Operations, such as, etching, patterning on die, coating with hydrophilic top surface, boiling enhancement coatings, may be performed. Other techniques may also be used, e.g., integrated heat spreader surface and warpage to bare die multi-chip module to reduce package/heatsink dynamic warpage due.

Figure 16:
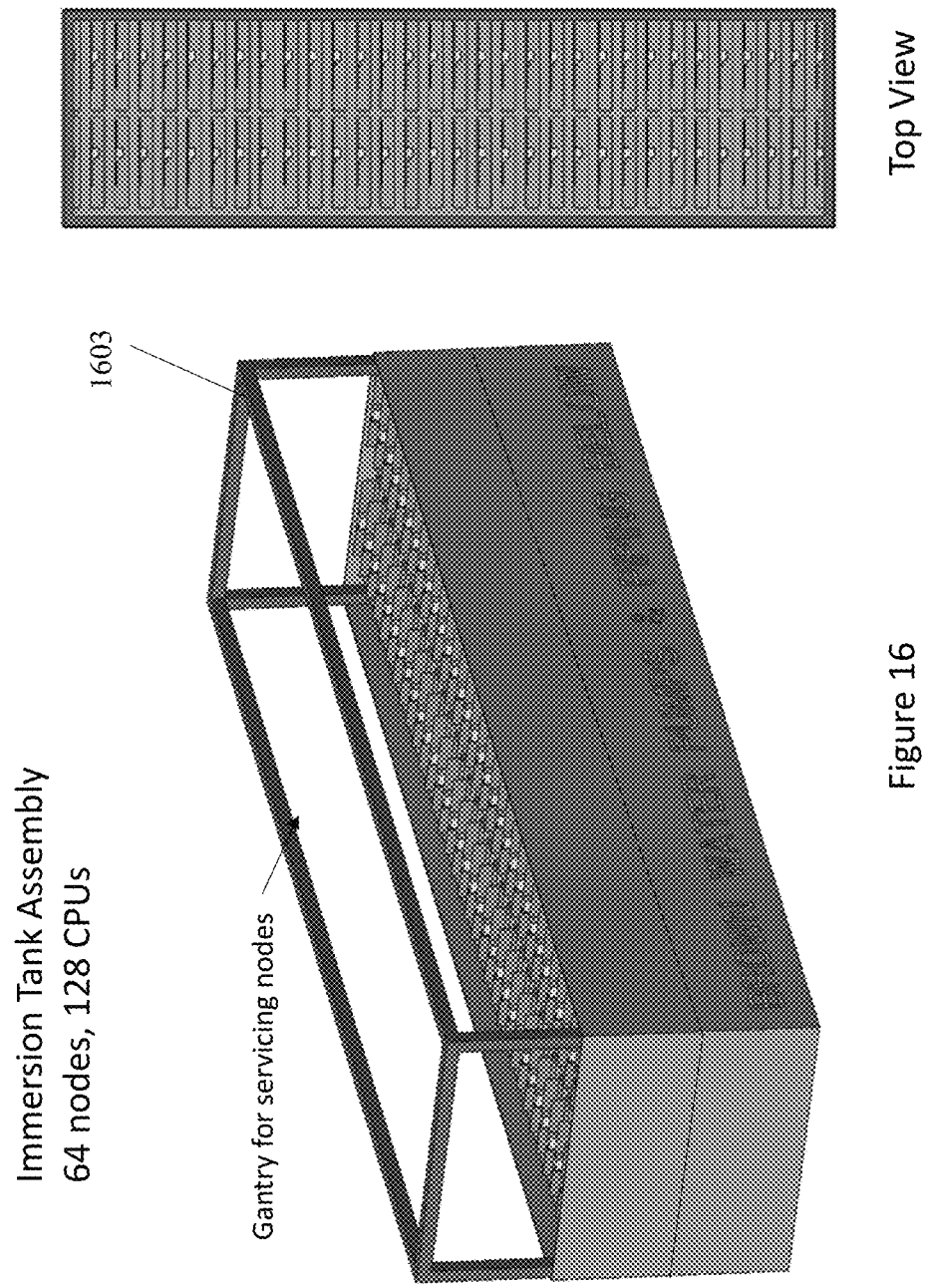
FIG. 16 illustrates another exemplary container to contain multiple heat sources, in accordance with various embodiments.

FIG. 16 illustrates another exemplary container 1603 to contain multiple heat sources, in accordance with various embodiments. In embodiments, the container 1603 may be an example of the container 103 as shown in FIG. 1(a).

In embodiments, the container 1603 may be a shipping container or pod, and may contain 1024 processors. The container 1603 may comprise a lower compartment for pump and plumbing base, a middle compartment for heat sinks and computing equipments with high-grade liquid coolant to surround the heat sources, and a top section gantry for mechanical or robotic system for assembly and services.

FIG. 17(a)-17(b) illustrate an exemplary shipping system 1700 including multiple containers, in accordance with various embodiments. The shipping system 1700 may include a truss structure 1713, a container 1703, e.g., a pod, which is similar to the container 1603 as shown in FIG. 16, and other components. The trust structure 1713 may be designed to improve the integrated damping system 1715 for shipping and handling.

Figure 18:
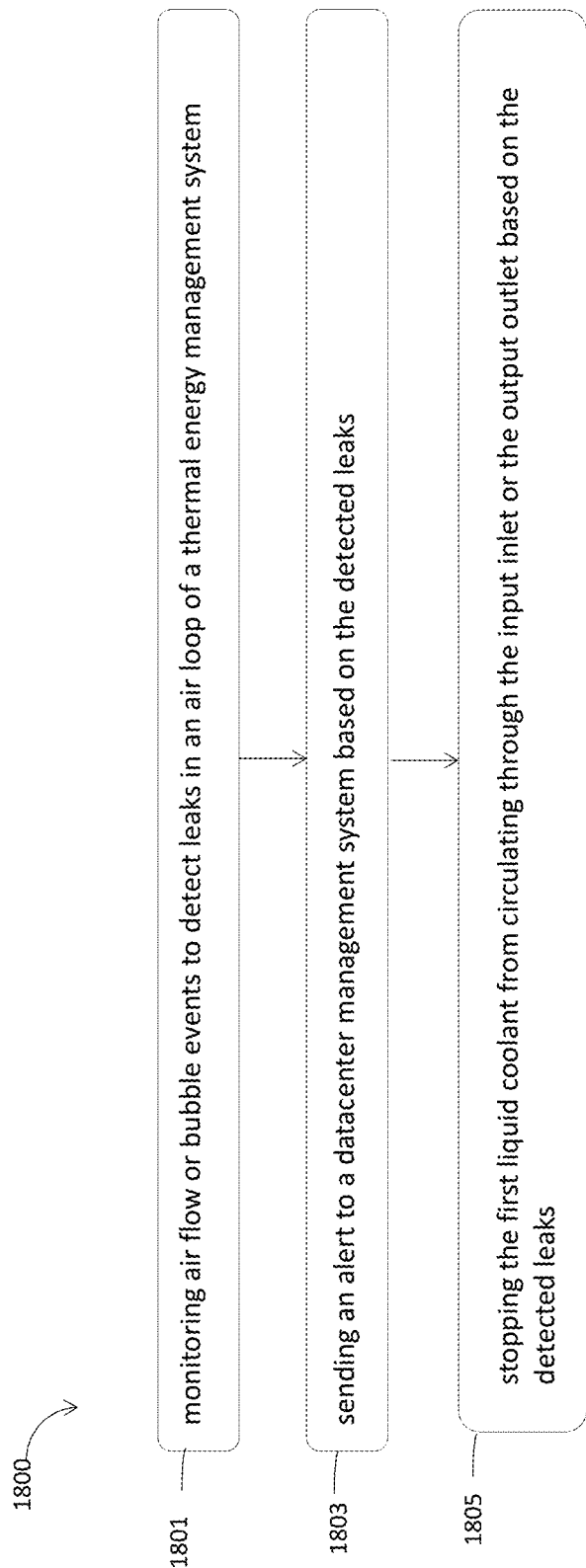
FIG. 18 illustrates example flow diagrams of a process including leak detection for an exemplary thermal energy management of a thermal energy management system, in accordance with various embodiments.
Figure 19:
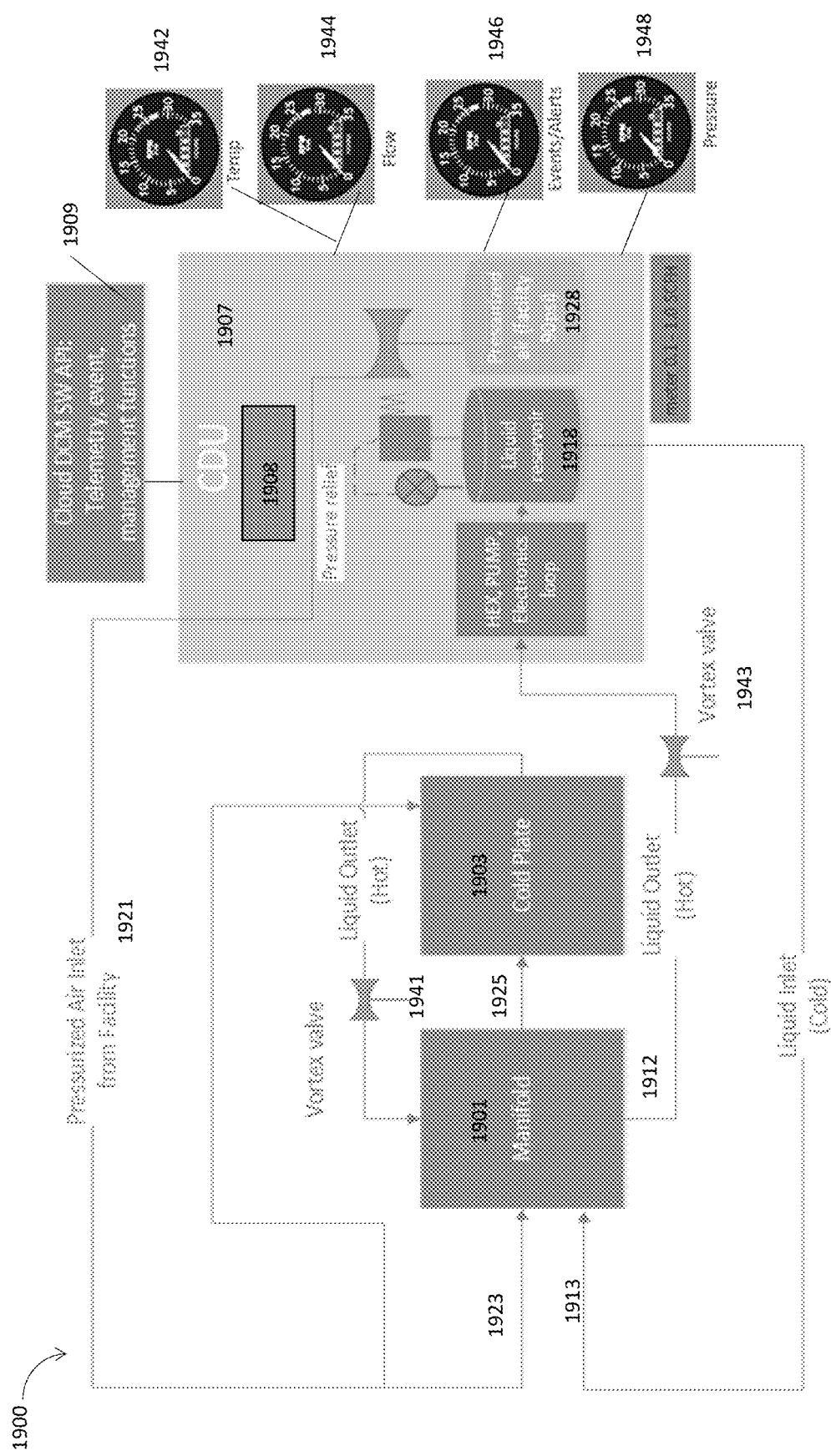
FIG. 19 illustrates an example thermal energy management system including leak detection function, in accordance with various embodiments.

FIG. 18 illustrates example flow diagrams of processes 1800 including leak detection for an exemplary thermal energy management of a thermal energy management system, in accordance with various embodiments. FIG. 19(a)-19(b) illustrate example thermal energy management system 1900 including leak detection, in accordance with various embodiments. In embodiments, the processes 1800 shown in FIG. 18 may be performed e.g., by a controller 1908 in the thermal energy management system 1900 shown in FIG. 19. The thermal energy management system 1900 includes a first container 1901, a second container 1903, and a CDU 1907, which are similar to the first container 101, the second container 103, and the CDU 107 as shown in FIG. 1(a).

In embodiments, the thermal energy management system 1900 includes the first container 1901 having an input inlet 1913, and an output outlet 1912 in a wall of the first container 1901. The input inlet 1913 and the output outlet 1912 are coupled to the CDU 1907, and more specifically, to a liquid coolant reservoir 1918. A first liquid coolant in the first container 1901 circulates through input inlet 1913, the liquid coolant reservoir 1918, the output outlet 1912, and a valve 1943. The second container 1903, e.g., a cold plate, may be contained within the first container 1901 and surrounded by the first liquid coolant. In addition, the thermal energy management system 1900 includes an air loop 1921 between the CDU 1907, the first container 1901, and the second container 1903. In detail, the air loop 1921 goes into the first container 1901 through an input inlet 1923, and out of the first container 1901 through an output outlet 1925 to the second container 1903. The air loop 1921 includes a pressurized air tank 1928, and a valve 1941. Furthermore, the CDU 1907 includes various telemetry, such as a temperature meter 1942, a flow meter 1944, an event or alerts meter 1946, and a pressure meter 1948. In addition, there is a datacenter management system 1909, which may reside in a cloud or on site at the CDU 1907.

In embodiments, the thermal energy management system 1900 depicts a cooling loop with a cold plate, e.g., the second container 1903, connected to a liquid manifold, e.g., the first container 1901, distributing liquid coolant from and return to the CDU 1907. Additional air loop 1921 is introduced at the liquid coolant interconnects to prevent liquid coolant leaks at the manifold and the cold plate. Vortex flow meters are added on the return loops to detect air bubbles introduced by a leaked event. The thermal energy management system 1900 has redundant air and vortex meters to improve the performance, but can also be implement non-redundant fashion. A precision air flow meter min 0.1-1 standard cubic feet per hour (SCFH) may be instrumented at the CDU pressurized air tank 1928 to monitor air flow.

The process 1800 may start at an interaction 1801. During the interaction 1801, operations may be performed to monitor air flow or bubble events to detect leaks in an air loop of a thermal energy management system. For example, during the interaction 1801, operations may be performed by the controller 1907 to monitor air flow or bubble events to detect leaks in the air loop 1921 of the thermal energy management system 1900.

During an interaction 1803, operations may be performed to send an alert to a datacenter management system based on the detected leaks. For example, at the interaction 1803, operations may be performed by the controller 1908 to send an alert to the datacenter management system 1909 based on the detected leaks.

During an interaction 1805, operations may be performed to stop the first liquid coolant from circulating through the input inlet or the output outlet based on the detected leaks. For example, at the interaction 1805, operations may be performed by the controller 1908 to stop the first liquid coolant from circulating through the input inlet 1913 or the output outlet 1912 based on the detected leaks. For example, the controller 1908 may shut off the liquid coolant flow valve 1943 to stop the first liquid coolant from circulating, or shut down the input inlet 1913 or the output outlet 1912 to stop supply of the first liquid coolant.

In embodiments, the processes 1800 and the thermal energy management system 1900 may be implemented and scaled to rack, cluster racks, and CDUs to pods and data-center level applications to prevent liquid cooling leaks, monitor and take appropriate management actions.

Figure 20:
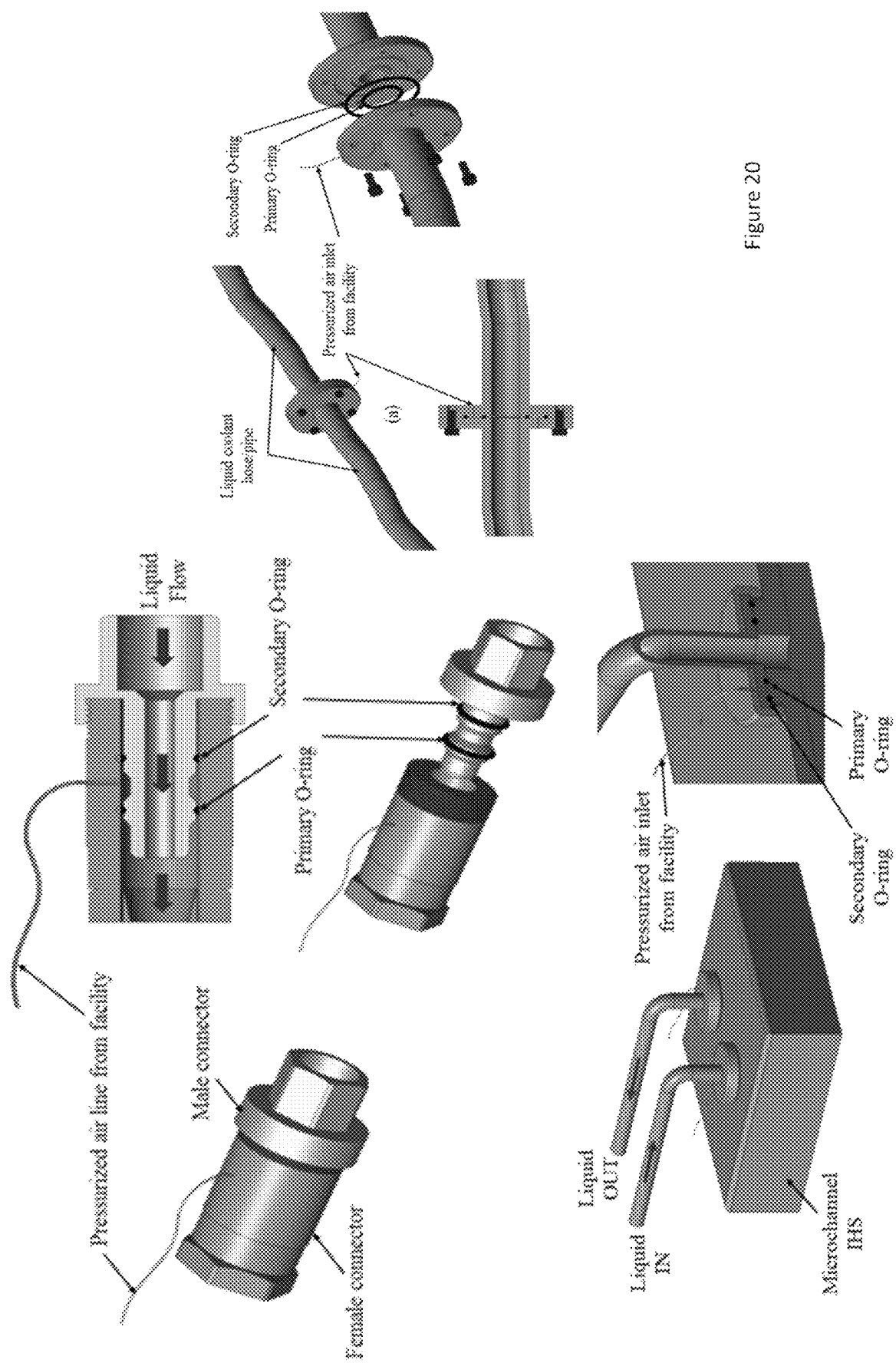
FIG. 20 illustrates example components for leak detection of a thermal energy management system, in accordance with various embodiments.

FIG. 20 illustrates example components for leak detection of a thermal energy management system, in accordance with various embodiments. In embodiments, the components shown in FIG. 20 may be used in the thermal energy management system 1900. Components may include various redundant O-ring design for leak prevention.

In embodiments, the real-time leak prevention method may inject pressurized air and detect air bubbles (upon failure of primary seal) at a local level (connectors/joints/couplings) and overall system level in the CDU. The CDU may be implemented at the rack level, at cluster level across multiple racks, or scalable to pod of clusters extensible to immersion cooling container scaled solutions. The leak detection may also act as leak prevention. For example, there may be a primary component and a secondary component, e.g., a primary O-ring and a secondary O-ring. When a leak is detected by detecting the failure of the primary component, the leak may be prevented by the secondary component.

Figure 21:
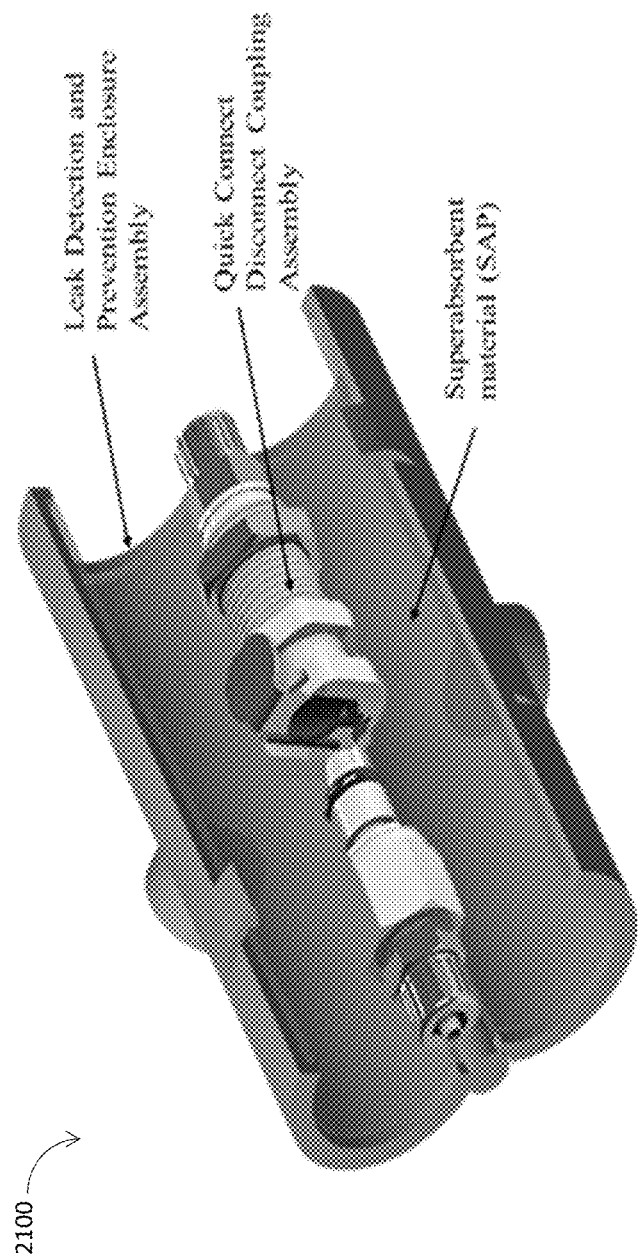
FIG. 21 illustrates example components for leak detection of a thermal energy management system, in accordance with various embodiments.

FIG. 21 illustrates example components for leak detection of a thermal energy management system, in accordance with various embodiments. In embodiments, the components shown in FIG. 21 may be used in the thermal energy management system 1900.

In embodiments, a leak detection and prevention enclosure assembly 2100 may include quick connect and disconnect coupling, superabsorbent polymer (SAP), mechanical actuator, and sensor. Once a leak is detected, the mechanical actuator may trigger an electrical short. Alternatively, an electrical actuator moisture sensor may detect moisture electrical shorts.

Figure 22:
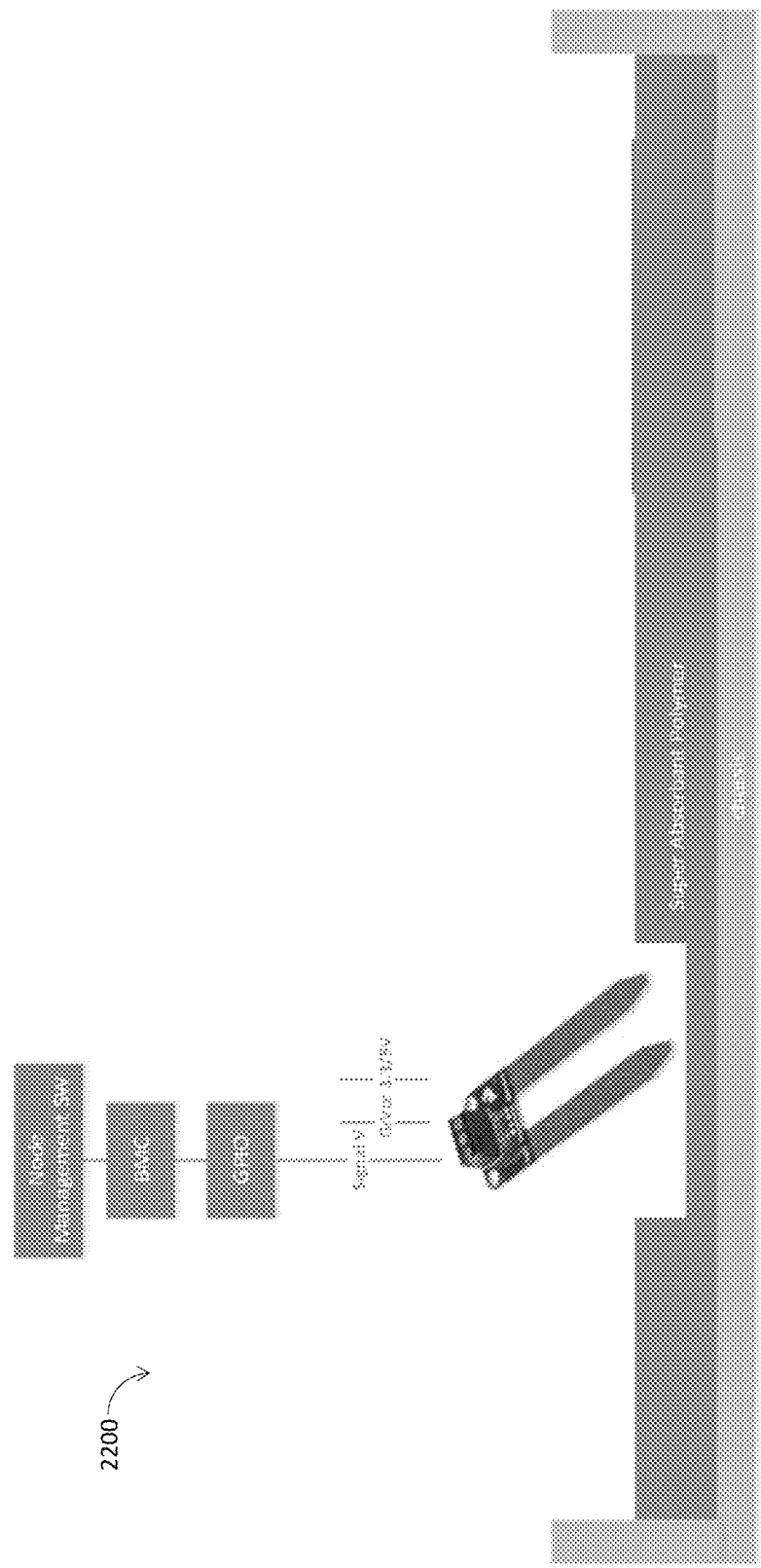
FIG. 22 illustrates example components for leak detection of a thermal energy management system, in accordance with various embodiments.

FIG. 22 illustrates example component 2200 for leak detection of a thermal energy management system, in accordance with various embodiments. In embodiments, the components shown in FIG. 22 may be used in the thermal energy management system 1900. FIG. 22 shows leak detection with SAP and moisture detection algorithm with electrical actuator for a node or a rack with multiple nodes in a chassis. When leaks occur inside a node or at rack level including multiple nodes, the SAP pad inside a node or a rack will absorb liquid coolant, while moisture sensors placed throughout SAP pad will short and detect leak. The electrical signal from moisture sensor is connected to a general purpose I/O (GPIO)-micro controller and managed by a baseboard management controller (BMC) based on an alert/control policy. The BMC or node management software (SW) may graceful shutdown the node when a leak is detected.

FIG. 23(a)-23(b) illustrate example component 2300 for leak detection of a thermal energy management system, in accordance with various embodiments. In embodiments, the component 2300 shown in FIG. 22 may be used in the thermal energy management system 1900. Mechanical actuator may be used for leak detection at container level. A contact 2301 may be open or closed depending on whether any leak is detected that can change a position of the SAP on a chassis base.

FIG. 24(a)-24(b) illustrate example components for leak detection of a thermal energy management system, in accordance with various embodiments. A pH electrode 2413 may be used to detect leaks from high grade liquid coolant in a second container 2403 into brown water in an immersion compute pod, which is a first container. In addition, the pH meter detection 2413 may also be used to collect data for failure prediction.

Figure 25:
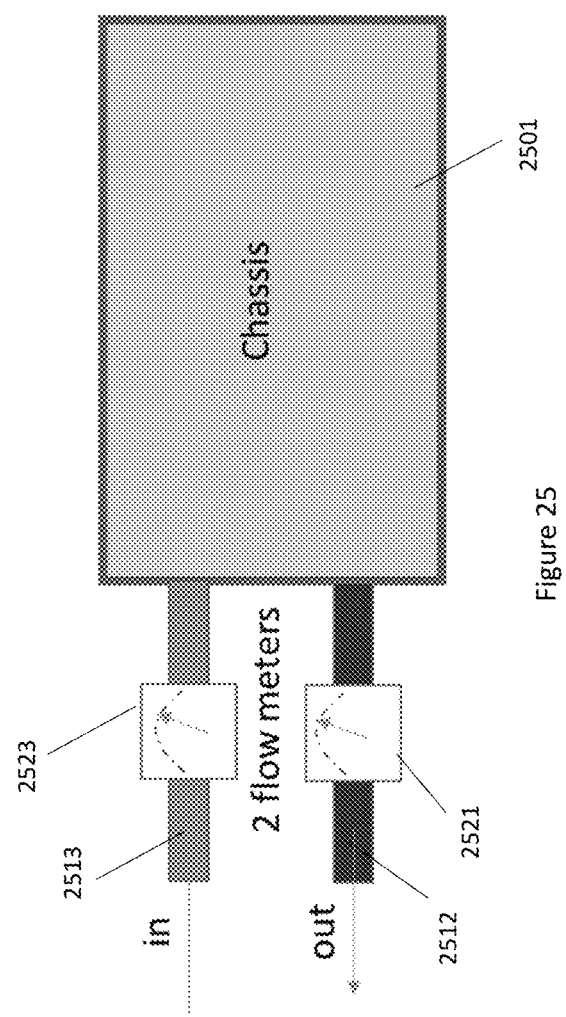
FIG. 25 illustrates example components for leak detection of a thermal energy management system, in accordance with various embodiments.

FIG. 25 illustrates example components for leak detection of a thermal energy management system, in accordance with various embodiments. Two flow meters, a flow meter 2521, and a flow meter 2523 are used. The flow meter 2523 is coupled to an input inlet 2513 to measure the amount of incoming liquid coolant, while the flow meter 2521 is coupled to an output outlet 2512 measure the amount of exit liquid coolant, respectively. If there is no leak inside the chassis, the flow meter readings should be equal between the two flow meters. When the difference between the readings is large enough, it would indicate that there is a leak inside the chassis.

Figure 26A:
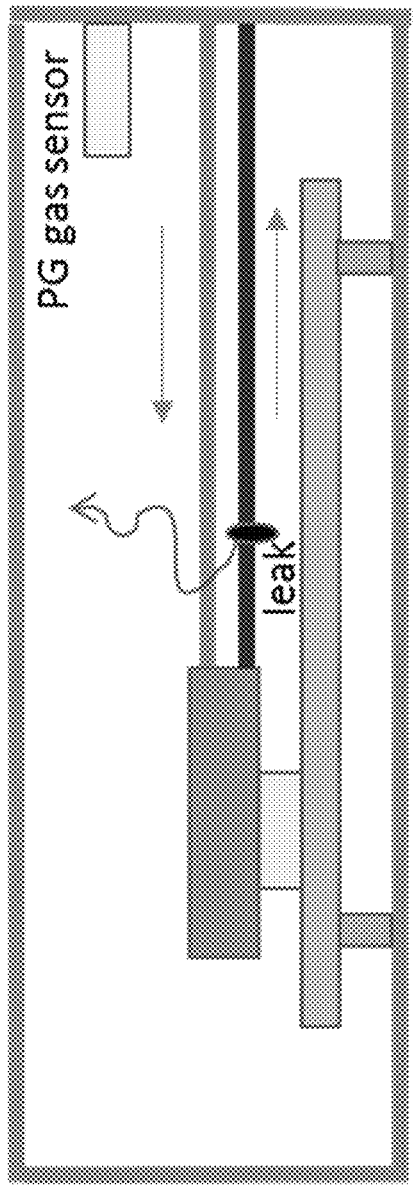
FIG. 26(a)-26(b) illustrate example components for leak detection of a thermal energy management system, in accordance with various embodiments.
Figure 26B:
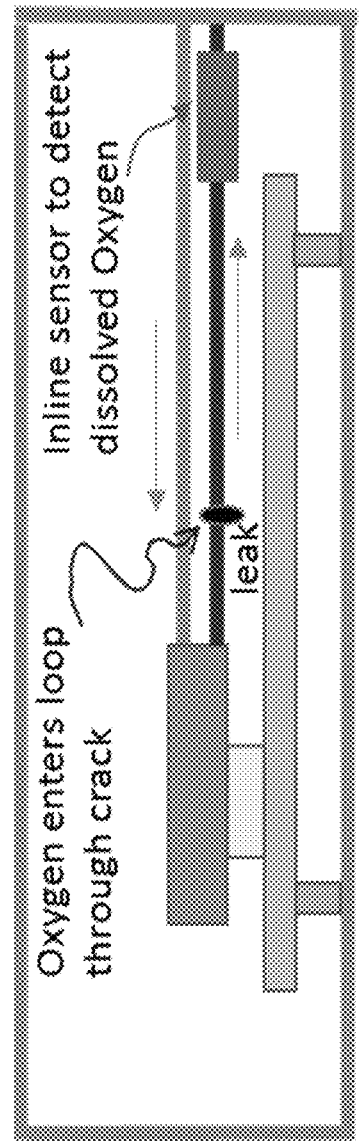

FIG. 26(a)-26(b) illustrate example components for leak detection of a thermal energy management system, in accordance with various embodiments. When leakage occurs within the chassis, a small amount of propylene glycol (PG) vapor escapes through the crack. A PG vapor detector is placed within the chassis to detect the presence of this vapor. When sufficient amount of PG vapor exists within the chassis, the sensor will trigger to indicate leakage has occurred within the chassis.

In addition, when leakage occurs within the chassis, small amount of oxygen will diffuse into the fluid loop and become dissolved into the coolant. Note that fluid loop is initially purged of air so very little oxygen should exist within the coolant. When the dissolved oxygen content reaches a predetermined concentration level the sensor will trigger to indicate a leakage has happened within the chassis.

Figure 27A:
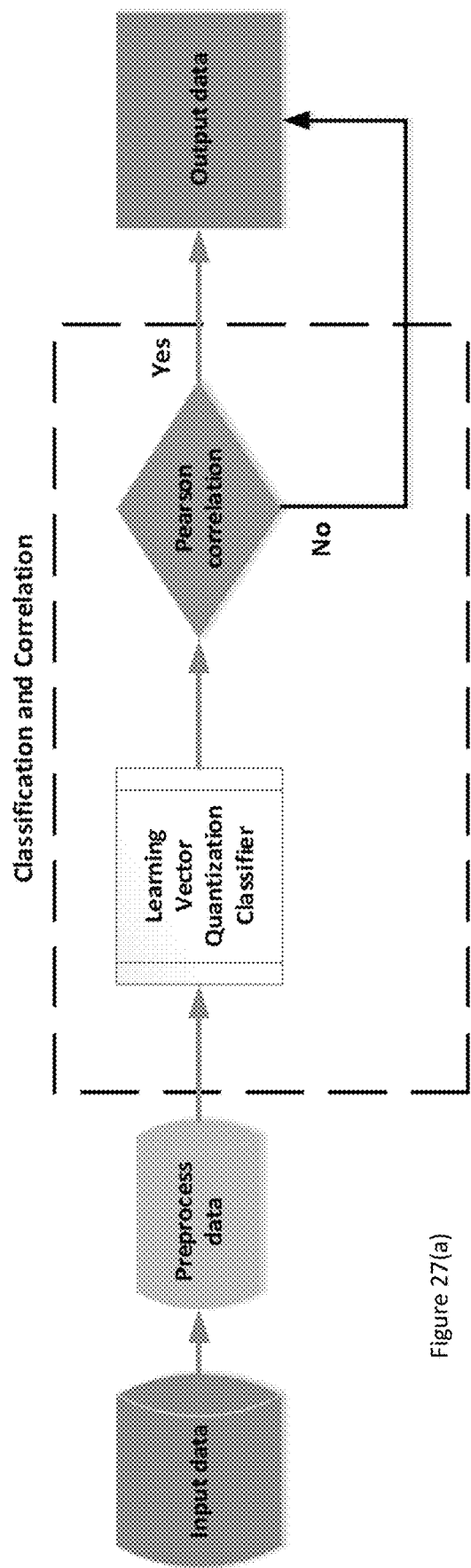
FIG. 27(a)-27(b) illustrate example thermal energy management system for predicting failures using collected dataset, in accordance with various embodiments.
Figure 27B:
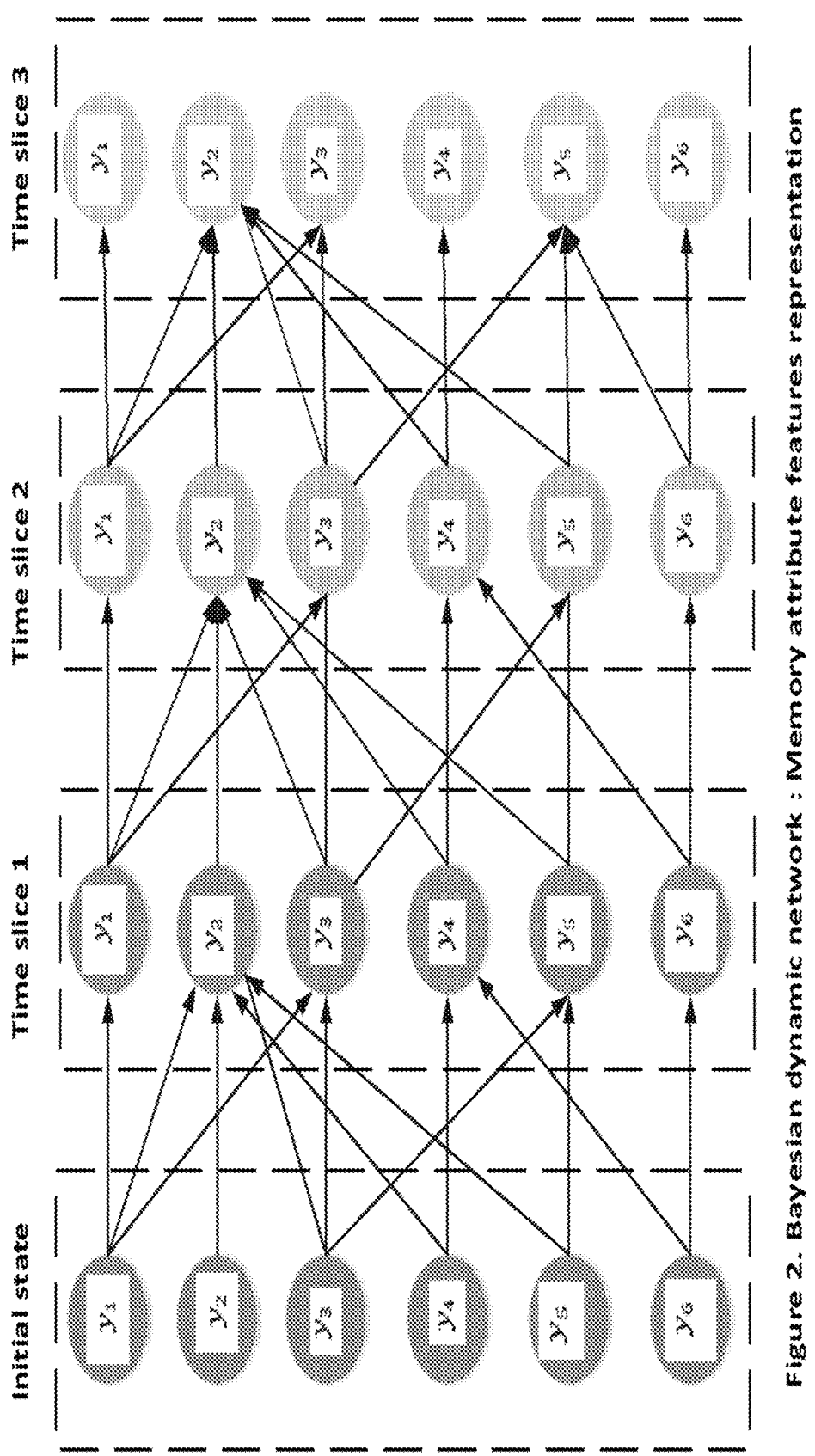

FIG. 27(a)-27(b) illustrate example thermal energy management system for predicting failures using collected dataset, in accordance with various embodiments. The thermal energy management system may be similar to the thermal energy management system 1900 shown in FIG. 19.

In embodiments, operations may be performed to collect data sets for managing the thermal energy management system throughout lifecycle of the thermal energy management system; and predict failures using current inputs and collected dataset based on a statistical model.

The thermal energy management system may build up system domain knowledge to discover failure mechanisms for the liquid coolant loop and reliability testing to model failures, characterize activation energy for components, subsystems, and systems. Machine learning may be employed to collect training data sets data center management lifecycle.

In embodiments, as shown in FIG. 27(a), once the data set has been collected, various operations such as preprocessing, classification, and correlation of data may be performed. Data preprocessing may be used to remove any irrelevant and redundant datasets. Learning Vector Quantization Classifier (LVQC) may be used to classify the datasets. Afterwards, the correlations for all of the datasets are computed, and the datasets are regrouped according to their correlation coefficients before they are stored in a database.

In embodiments, as shown in FIG. 27(b), statistical models, e.g., a Bayesian network, may be developed to predict failure using input and the collected dataset. The relationships between each of collected and input dataset may be determined. For example, Y represents an observed dataset, defined as $Y=\{y_1, y_2, \ldots, y_n\}$ and the elements in the FIG. 27(b). Similarly, Y' represents as initial states as $Y'=\{y_1', y_2', y_3', y_4', y_5', y_6'\}$. The probability density function of the initial state and observed states can be combined. The posterior distribution may be formed, which represents total knowledge about the parameters. Finally, expected parameters and predictor for states failure probability may be calculated based on the statistical model.

Figure 28:
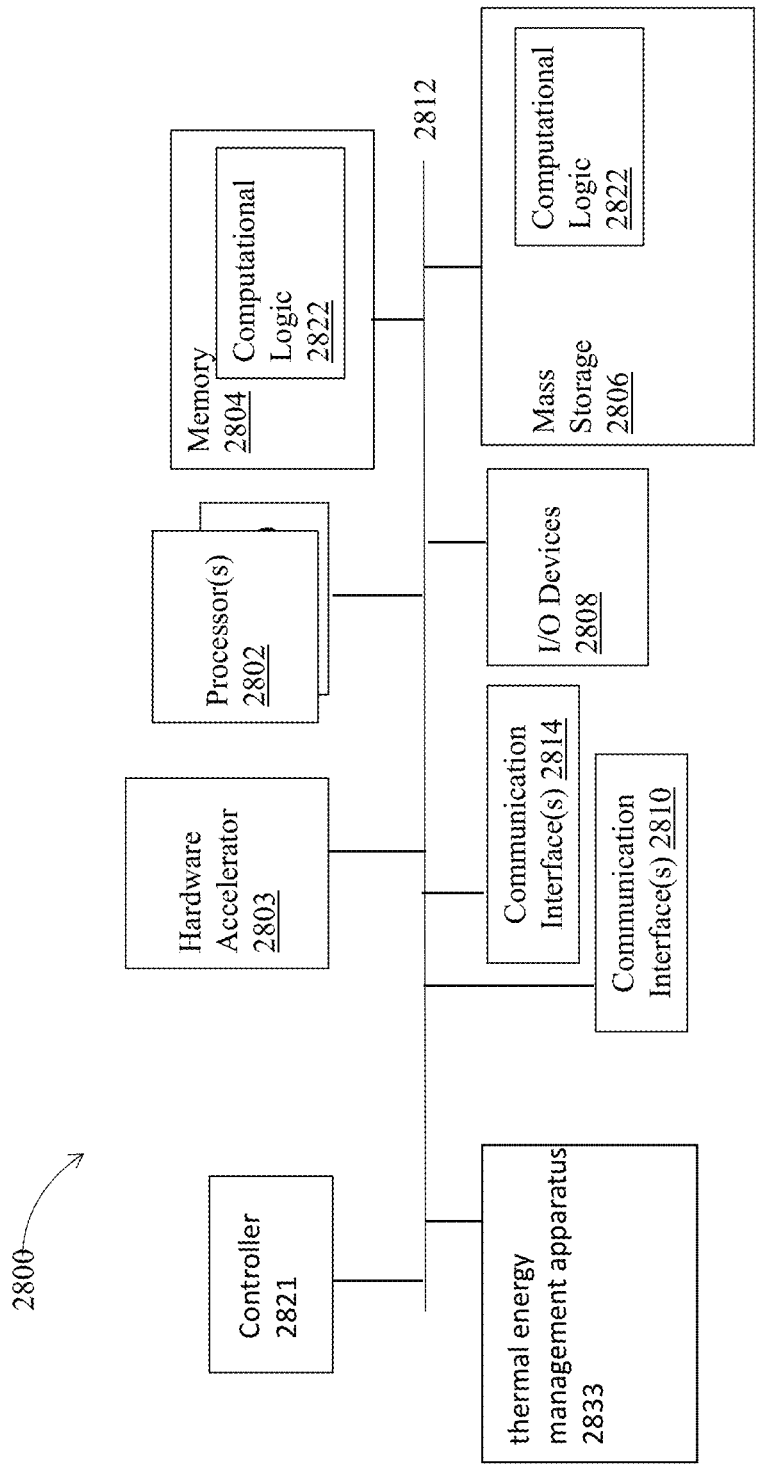
FIG. 28 illustrates an example device suitable for use to practice various aspects of the present disclosure, in accordance with various embodiments.

FIG. 28 illustrates an example device 2800 suitable for use to practice various aspects of the present disclosure, in accordance with various embodiments. The device 2800 may be computing, networking or storage device incorporated with the thermal energy management teaching of the present disclosure, e.g., a thermal energy management system having the CDU 1907, including the controller 1908, and the datacenter management system 1909.

As shown, the device 2800 may include one or more processors 2802, each having one or more processor cores, and optionally, a hardware accelerator 2803 (which may be an ASIC or a FPGA). In alternate embodiments, the hardware accelerator 2803 may be part of processor 2802, or integrated together on a SOC. Additionally, the device 2800 may include a memory 2804, which may be any one of a number of known persistent storage medium, and mass storage 2806. Furthermore, the device 2800 may include communication interfaces 2810 and 2814. Communication interfaces 2810 and 2814 may be any one of a number of known communication interfaces. In addition, the device 2800 may include input/output devices 2808. In embodiments, one or more (or aspects thereof) of the process 1800 shown in FIG. 18 may be implemented with as part of computational logic 2822 disposed in memory 2804. In addition, the device 2800 may include a controller 2821 to execute computational logic 2822, a thermal energy management apparatus 2833. The controller 2821, thermal energy management apparatus 2833, and the one or more processors 2802 may be similar to the controller 1908, the first container 1901, the second container 1903, and the datacenter management system 1909, respectively, as shown in FIG. 19. The elements may be coupled to each other via system bus 2812, which may represent one or more buses.

In the case of multiple buses, they may be bridged by one or more bus bridges (not shown). In alternate embodiments, computational logic 2822 executed by controller 2821 may be disposed in memory areas/units separated from memory 2804 used by processors 2802 (and other computing elements).

Each of these elements may perform its conventional functions known in the art. In particular, computational logic 2822 stored in system memory 2804 and mass storage 2805, in the form of a working copy and a permanent copy of programming instructions, in addition to implementing the operations associated with the power control operations of the present disclosure, may also implement an operating system and one or more applications. The computational logic 2822 may be implemented by assembler instructions supported by processor(s) 2802 or high-level languages, such as, for example, C, that can be compiled into such instructions.

The various elements may be implemented by assembler instructions supported by processor(s) 2802 or high-level languages, such as, for example, C, that can be compiled into such instructions. Operations associated with safety operations and configuration of safety operations not implemented in software may be implemented in hardware, e.g., via hardware accelerator 2803.

The number, capability and/or capacity of these elements 2801-2833 may vary, depending on the number of other devices the device 2800 is configured to support. Otherwise, the constitutions of elements 2801-2833 are known, and accordingly will not be further described.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module," or "system."

Figure 29:
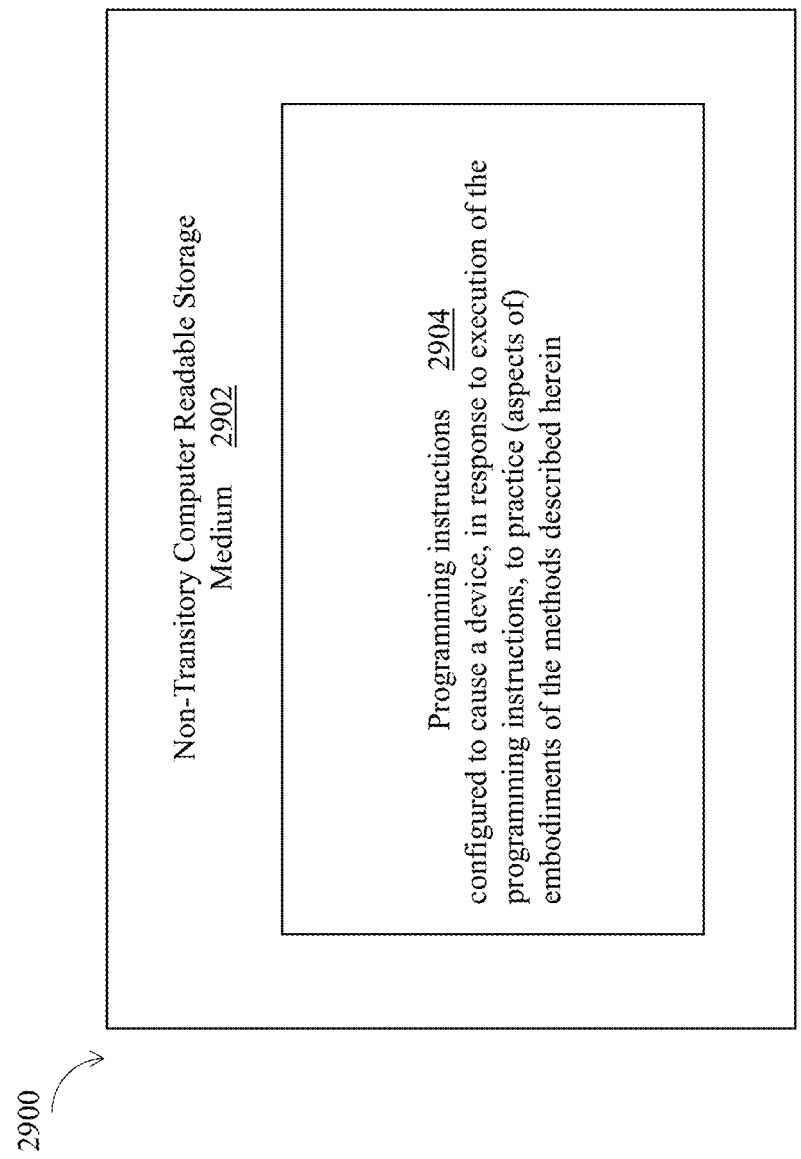
FIG. 29 illustrates a storage medium having instructions for practicing methods described with references to FIGS. 1-28, in accordance with various embodiments.

Furthermore, the present disclosure may take the form of a computer program product embodied in any tangible or non-transitory medium of expression having computer-usable program code embodied in the medium. FIG. 29 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 2902 may include a number of programming instructions 2904. Programming instructions 2904 may be configured to enable the controller 2821 to perform thermal energy management of a thermal energy management system, as outlined in the process 1800 shown in FIG. 18.

In alternate embodiments, programming instructions 2904 may be disposed on multiple computer-readable non-transitory storage media 2902 instead. In alternate embodiments, programming instructions 2904 may be disposed on computer-readable transitory storage media 2902, such as, signals. Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments may be implemented as a computer process, a computing system or as an article of manufacture such as a computer program product of computer readable media. The computer program product may be a computer storage medium readable by a computer system and encoding a computer program instructions for executing a computer process.

The corresponding structures, material, acts, and equivalents of all means or steps plus function elements in the claims below are intended to include any structure, material or act for performing the function in combination with other claimed elements are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment are chosen and described in order to best explain the principles of the disclosure and the practical application, and to enable others of ordinary skill in the art to understand the disclosure for embodiments with various modifications as are suited to the particular use contemplated.

Thus various example embodiments of the present disclosure have been described including, but are not limited to:

EXAMPLES

Example 1 may include an apparatus for thermal energy management, comprising: a first container having one or more cavities including a first cavity, wherein the first container includes a first material in a wall of the first container, one or more input inlets in the wall, and one or more output outlets in the wall, wherein the first container is arranged to hold a first liquid coolant within the first cavity to at least partially surround one or more containers including a second container, the first liquid coolant, when held, circulates through at least an input inlet of the one or more input inlets and at least an output outlet of the one or more output outlets, and wherein the second container includes a second material in a wall of the second container, and a second cavity configured to hold one or more heat sources, and a second liquid coolant to at least partially surround the one or more heat sources, the second container is sealed to separate the first liquid coolant from the second liquid coolant.

Example 2 may include the apparatus of example 1 and/or some other examples herein, further comprising the second container.

Example 3 may include the apparatus of example 2 and/or some other examples herein, further comprising a third container placed within the first cavity of the first container, with the first liquid coolant at least partially surrounding the third container, wherein the third container includes a third cavity, and a third liquid coolant within the third cavity to at least partially surround the second container that is placed within the third cavity of the third container.

Example 4 may include the apparatus of example 1 and/or some other examples herein, wherein the wall of the first container or the wall of the second container includes multiple different materials.

Example 5 may include the apparatus of example 1 and/or some other examples herein, wherein the output outlet is coupled with an external coolant distribution unit (CDU) that is separately fabricated.

Example 6 may include the apparatus of example 1 and/or some other examples herein, wherein the one or more heat sources include a memory unit, a server, a computing unit, or a storage unit.

Example 7 may include the apparatus of example 1 and/or some other examples herein, wherein the one or more heat sources includes a die having a hydrophilic coating, or a boiling enhancement coating, at a surface of the die, and the one or more heat sources have been surface treated for operating within the second liquid coolant.

Example 8 may include the apparatus of example 1 and/or some other examples herein, wherein the second liquid coolant has a thermal conductivity higher than a thermal conductivity of the first liquid coolant.

Example 9 may include the apparatus of example 1 and/or some other examples herein, wherein the first liquid coolant includes water.

Example 10 may include the apparatus of example 1 and/or some other examples herein, wherein the second liquid coolant includes diethyl benzene, dibenzyl toluene, diaryl alkyl, partially hydrogenated terphenyl, or a cooling dielectric fluid.

Example 11 may include the apparatus of example 1 and/or some other examples herein, further comprising: a mechanical supporting system to support the one or more containers including the second container, or the one or more heat sources.

Example 12 may include the apparatus of example 11 and/or some other examples herein, wherein the mechanical supporting system includes a rack rail with a slider mounting mechanism, a 3-axis suspension system, or wire mesh stiffener structure.

Example 13 may include the apparatus of example 1 and/or some other examples herein, wherein the second material in the wall of the second container has a thermal conductivity higher than a thermal conductivity of the first material in the wall of the first container.

Example 14 may include the apparatus of example 1 and/or some other examples herein, wherein the second material in the wall of the second container includes silicone polymer, or aluminum metallic.

Example 15 may include the apparatus of example 1 and/or some other examples herein, wherein the second container includes a wave generator to generate closed and forced circulation wave of the second liquid coolant to circulate within the second container.

Example 16 may include the apparatus of example 15 and/or some other examples herein, wherein the wave generator includes a piezo diaphragm actuator, pneumatic actuation (pressurized air), or a liquid cooled pump.

Example 17 may include the apparatus of example 15 and/or some other examples herein, wherein the second container includes a mechanical vibration unit to change vibration frequency to prevent contaminant build up on the second container.

Example 18 may include the apparatus of example 1 and/or some other examples herein, wherein at least one or more parts of the wall of the first container is shared with the second container.

Example 19 may include the apparatus of example 18 and/or some other examples herein, wherein a part of the one or more parts of the wall of the first container shared with the second container includes a cold plate.

Example 20 may include the apparatus of example 18 and/or some other examples herein, wherein the at least one or more parts of the wall of the first container shared with the second container includes one or more fins.

Example 21 may include a method for thermal energy management of a thermal energy management system, comprising: monitoring air flow or bubble events to detect leaks in an air loop of a thermal energy management system, wherein the thermal energy management system includes: a coolant distribution unit (CDU); a first container having one or more input inlets in a wall, and one or more output outlets in the wall, wherein an output outlet of the one or more output outlets or an input inlet of the one or more input inlets is coupled with the CDU, the first container includes one or more cavities including a first cavity, the first container is configured to hold a first liquid coolant within the first cavity to at least partially surround one or more containers including a second container, the first liquid coolant, when held, circulates through at least the input inlet or at least the output outlet, the second container includes a second cavity configured to hold one or more heat sources, and a second liquid coolant to at least partially surround the one or more heat sources, the second container is sealed to separate the first liquid coolant from the second liquid coolant; and the air loop between the CDU, the first container, and the second container; sending an alert to a datacenter management system based on the detected leaks; and stopping the first liquid coolant from circulating through the input inlet or the output outlet based on the detected leaks.

Example 22 may include the method of example 21 and/or some other examples herein, wherein the stopping the first liquid coolant from circulating includes: shutting off liquid coolant flow valves in the CDU; or shutting down the input inlet to stop supply of the first liquid coolant.

Example 23 may include the method of example 21 and/or some other examples herein, further comprising: collecting data sets for managing the thermal energy management system throughout lifecycle of the thermal energy management system; and predicting failures using current inputs and collected dataset based on a statistical model.

Example 24 may include a thermal energy management system, comprising: a coolant distribution unit (CDU); a first container having one or more input inlets in a wall, and one or more output outlets in the wall, wherein an output outlet of the one or more output outlets or an input inlet of the one or more input inlets is coupled with the CDU, the first container includes one or more cavities including a first cavity, the first container is configured to hold a first liquid coolant within the first cavity to at least partially surround one or more containers including a second container, the first liquid coolant, when held, circulates through at least the input inlet or at least the output outlet, the second container includes a second cavity configured to hold one or more heat sources, and a second liquid coolant to at least partially surround the one or more heat sources, the second container is sealed to separate the first liquid coolant from the second liquid coolant; and an air loop between the CDU, the first container, and the second container.

Example 25 may include the thermal energy management system of example 24 and/or some other examples herein, further comprising the second container, and a mechanical supporting system to support the one or more containers including the second container, or the one or more heat sources.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

Although certain embodiments have been illustrated and described herein for purposes of description this application is intended to cover any adaptations or variations of the embodiments discussed herein. Therefore, it is manifestly intended that embodiments described herein be limited only by the claims.

What is claimed is:

1. An apparatus for thermal energy management, comprising:
    a first container having one or more cavities including a first cavity, wherein the first container includes a first material in a wall of the first container, one or more input inlets in the wall, and one or more output outlets in the wall,
    wherein the first container is arranged to hold a first liquid coolant within the first cavity to at least partially surround one or more containers including a second container, the first liquid coolant, when held, circulates through at least an input inlet of the one or more input inlets and at least an output outlet of the one or more output outlets, and
    wherein the second container includes a second material in a wall of the second container, and a second cavity configured to hold one or more heat sources, and a second liquid coolant to at least partially surround the one or more heat sources, the second container is sealed to separate the first liquid coolant from the second liquid coolant; and wherein the apparatus further comprises a mechanical supporting system to support the one or more containers including the second container, or the one or more heat sources.

2. The apparatus of claim 1, further comprising a third container placed within the first cavity of the first container, with the first liquid coolant at least partially surrounding the third container, wherein the third container includes a third cavity, and a third liquid coolant within the third cavity to at least partially surround the second container that is placed within the third cavity of the third container.

3. The apparatus of claim 1, wherein the wall of the first container or the wall of the second container includes multiple different materials.

4. The apparatus of claim 1, wherein the output outlet is coupled with an external coolant distribution unit (CDU) that is separately fabricated.

5. The apparatus of claim 1, wherein the one or more heat sources include a memory unit, a server, a computing unit, or a storage unit.

6. The apparatus of claim 1, wherein the one or more heat sources include a die having a hydrophilic coating, or a boiling enhancement coating, at a surface of the die, and the one or more heat sources have been surface treated for operating within the second liquid coolant.

7. The apparatus of claim 1, wherein the second liquid coolant has a thermal conductivity higher than a thermal conductivity of the first liquid coolant.

8. The apparatus of claim 1, wherein the first liquid coolant includes water.

9. The apparatus of claim 1, wherein the second liquid coolant includes diethyl benzene, dibenzyl toluene, diaryl alkyl, partially hydrogenated terphenyl, or a cooling dielectric fluid.

10. The apparatus of claim 1, wherein the mechanical supporting system includes a rack rail with a slider mounting mechanism, a 3-axis suspension system, or wire mesh stiffener structure.

11. The apparatus of claim 1, wherein the second material in the wall of the second container has a thermal conductivity higher than a thermal conductivity of the first material in the wall of the first container.

12. The apparatus of claim 1, wherein the second material in the wall of the second container includes silicone polymer, or aluminum metallic.

13. The apparatus of claim 1, wherein the second container includes a wave generator to generate a closed and forced circulation wave of the second liquid coolant to circulate within the second container.

14. The apparatus of claim 13, wherein the wave generator includes a piezo diaphragm actuator, pneumatic actuation (pressurized air), or a liquid cooled pump.

15. An apparatus for thermal energy management, comprising:
a first container having one or more cavities including a first cavity, wherein the first container includes a first material in a wall of the first container, one or more input inlets in the wall, and one or more output outlets in the wall,
wherein the first container is arranged to hold a first liquid coolant within the first cavity to at least partially surround one or more containers including a second container, the first liquid coolant, when held, circulates through at least an input inlet of the one or more input inlets and at least an output outlet of the one or more output outlets, wherein the second container includes a second material in a wall of the second container, and a second cavity configured to hold one or more heat sources, and a second liquid coolant to at least partially surround the one or more heat sources, the second container is sealed to separate the first liquid coolant from the second liquid coolant, and wherein the second container includes a mechanical vibration unit to change vibration frequency to prevent contaminant build up on the second container.

16. The apparatus of claim 15, wherein at least one or more parts of the wall of the first container is shared with the second container.

17. The apparatus of claim 16, wherein a part of the one or more parts of the wall of the first container shared with the second container includes a cold plate.

18. The apparatus of claim 16, wherein the at least one or more parts of the wall of the first container shared with the second container includes one or more fins.

19. A method for thermal energy management of a thermal energy management system, comprising:
monitoring air flow or bubble events to detect leaks in an air loop of a thermal energy management system, wherein the thermal energy management system includes:
a coolant distribution unit (CDU);
a first container having one or more input inlets in a wall, and one or more output outlets in the wall, wherein an output outlet of the one or more output outlets or an input inlet of the one or more input inlets is coupled with the CDU, the first container includes one or more cavities including a first cavity, the first container is configured to hold a first liquid coolant within the first cavity to at least partially surround one or more containers including a second container, the first liquid coolant, when held, circulates through at least the input inlet or at least the output outlet, the second container includes a second cavity configured to hold one or more heat sources, and a second liquid coolant to at least partially surround the one or more heat sources, the second container is sealed to separate the first liquid coolant from the second liquid coolant; and
wherein the air loop is between the CDU, the first container, and the second container;
sending an alert to a datacenter management system based on the detected leaks; and
stopping the first liquid coolant from circulating through the input inlet or the output outlet based on the detected leaks.

20. The method of claim 19, wherein the stopping the first liquid coolant from circulating includes:
shutting off liquid coolant flow valves in the CDU; or
shutting down the input inlet to stop supply of the first liquid coolant.

21. The apparatus of claim 19, further comprising:
collecting data sets for managing the thermal energy management system throughout a lifecycle of the thermal energy management system; and
predicting failures using current inputs and collected dataset based on a statistical model.

22. A thermal energy management system, comprising:
a coolant distribution unit (CDU);

a first container having one or more input inlets in a wall, and one or more output outlets in the wall, wherein an output outlet of the one or more output outlets or an input inlet of the one or more input inlets is coupled with the CDU, the first container includes one or more cavities including a first cavity, the first container is configured to hold a first liquid coolant within the first cavity to at least partially surround one or more containers including a second container, the first liquid coolant, when held, circulates through at least the input inlet or at least the output outlet, the second container includes a second cavity configured to hold one or more heat sources, and a second liquid coolant to at least partially surround the one or more heat sources, the second container is sealed to separate the first liquid coolant from the second liquid coolant; and an air loop between the CDU, the first container, and the second container.

23. The thermal energy management system of claim 22, further comprising the second container, and a mechanical supporting system to support the one or more containers including the second container, or the one or more heat sources.

* * * * *